United States Patent
Ishii et al.

(10) Patent No.: US 8,928,419 B2
(45) Date of Patent: Jan. 6, 2015

(54) RESONATING ELEMENT, RESONATOR, ELECTRONIC DEVICE, ELECTRONIC APPARATUS, AND MOVING BODY

(71) Applicant: Seiko Epson Corporation, Tokyo (JP)

(72) Inventors: Osamu Ishii, Tatsuno-machi (JP); Masataka Nomura, Minowa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/915,740

(22) Filed: Jun. 12, 2013

(65) Prior Publication Data

US 2013/0335157 A1    Dec. 19, 2013

(30) Foreign Application Priority Data

Jun. 13, 2012 (JP) ................................. 2012-133533

(51) Int. Cl.
*H03B 5/00* (2006.01)
*H01L 41/047* (2006.01)
*H03B 5/32* (2006.01)
*H03H 9/05* (2006.01)
*H03H 9/10* (2006.01)
*H03B 5/36* (2006.01)

(52) U.S. Cl.
CPC .............. *H01L 41/0475* (2013.01); *H03B 5/32* (2013.01); *H03H 9/0547* (2013.01); *H03H 9/1021* (2013.01); *H03B 5/368* (2013.01)
USPC ................... 331/107 R; 331/116 R; 331/154; 331/158; 310/365

(58) Field of Classification Search
USPC ........... 331/107 R, 116 R, 154, 158; 310/365
See application file for complete search history.

(56) References Cited

U.S. PATENT DOCUMENTS

| | | | |
|---|---|---|---|
| 5,319,324 A * | 6/1994 | Satoh et al. | 331/158 |
| 7,235,913 B2 * | 6/2007 | Iwata | 310/320 |
| 2004/0135644 A1 * | 7/2004 | Mizoguchi et al. | 331/154 |
| 2008/0315965 A1 * | 12/2008 | Makuta et al. | 331/116 R |
| 2010/0045393 A1 | 2/2010 | Naito | |

FOREIGN PATENT DOCUMENTS

| JP | 61-251305 | 11/1986 |
|---|---|---|
| JP | 01-179514 | 7/1989 |
| JP | 02-226905 | 9/1990 |
| JP | 03-079111 | 4/1991 |
| JP | 07-122964 | 5/1995 |
| JP | 09-162681 | 6/1997 |
| JP | 2004-350255 | 12/2004 |
| JP | 2005-020634 | 1/2005 |
| JP | 2010-050508 A | 3/2010 |
| JP | 2010-193208 A | 9/2010 |
| JP | 2011147053 A | 7/2011 |
| JP | 2012-129679 A | 7/2012 |
| JP | 2012-191559 A | 10/2012 |
| JP | 2012-191560 A | 10/2012 |

* cited by examiner

*Primary Examiner* — Robert Pascal
*Assistant Examiner* — Jeffrey Shin
(74) *Attorney, Agent, or Firm* — Harness, Dickey & Pierce, P.L.C.

(57) ABSTRACT

A resonating element includes a resonator element that includes a vibrating portion and an excitation electrode provided on both main surfaces of the vibrating portion, an intermediate substrate in which the resonator element is mounted so as to be spaced from the excitation electrode, and a spiral electrode pattern that is provided on at least one main surface of the intermediate substrate, in which the electrode pattern is electrically connected to the excitation electrode.

16 Claims, 21 Drawing Sheets

RESONATING ELEMENT, RESONATOR, ELECTRONIC DEVICE, ELECTRONIC APPARATUS, AND MOVING BODY

BACKGROUND

1. Technical Field

The present invention relates to a resonating element, a resonator, an electronic device, an electronic apparatus, and a moving body.

2. Related Art

In the related art, a surface mounting type electronic device has been widely used in which a piezoelectric resonator element where an excitation electrode is formed on a piezoelectric substrate is air-tightly sealed in a package. Here, the piezoelectric resonator element uses an AT cut quartz crystal resonator element or the like which performs thickness-shear vibration and employs, for example, a thin plate into which a piezoelectric substrate is cut at a cut angle called an AT cut, by using the characteristics in which the thin plate into which the piezoelectric substrate such as a quartz crystal is cut at a predetermined angle and thickness has an inherent resonance frequency.

For example, a surface mounting type quartz crystal oscillator, in which a quartz crystal resonator element and electronic parts such as semiconductor circuit elements including an oscillation circuit which oscillates the quartz crystal resonator element are mounted in the same package and are sealed, is used as an electronic device provided with the quartz crystal resonator element, and is widely used as a reference source of a frequency or time.

JP-A-2010-50508 discloses a quartz crystal oscillator in which a quartz crystal resonator is mounted on a pedestal formed by a quartz crystal which is disposed on an electronic part and an IC so as to substantially cover an opening of a recess of a container, in order to solve the problem that stable frequency-temperature characteristics cannot be obtained since stress distortion occurs due to a difference between linear expansion coefficients of a package material and the quartz crystal, resulting from an ambient temperature variation if a quartz crystal resonator element is directly mounted on a package using a conductive adhesive or the like.

FIG. 7 is a circuit diagram illustrating an example of a voltage controlled quartz crystal oscillator in the related art. The reference sign X1 indicates a quartz crystal resonator, the reference sign A1 indicates an amplifier, the reference signs Ca and Cb indicate capacitors, the reference sign D1 indicates a variable capacitance diode, the reference sign IN indicates a control voltage input terminal, the reference sign Rd indicates a resistor for applying a control voltage, and the reference sign OUT indicates a frequency output terminal of a voltage controlled quartz crystal oscillator.

In addition, a general equivalent circuit of the quartz crystal resonator X1 is shown in FIG. 8. In FIG. 8, the reference sign L1 indicates an equivalent series inductance, the reference sign C1 indicates an equivalent series capacitance, the reference sign R1 indicates an equivalent series resistance, and the reference sign C0 indicates a parallel capacitance.

If a load capacitance (combined capacitance) of a circuit side including the amplifier A1, viewed from the quartz crystal resonator X1 is set to CL, and a capacitance ratio is set to $\gamma$(C0/C1), a variation $\Delta f/f0$ of the resonance frequency f0 depending on the load capacitance CL is represented by the following well-known equation.

$$\Delta f/f0 = C0/(2\gamma(C0+CL))$$

In other words, in relation to a frequency of the voltage controlled quartz crystal oscillator, the resonance frequency thereof varies depending on a variation in the load capacitance of an oscillation loop.

In addition, the variable capacitance diode D1 is a diode of which a capacitance value varies depending on a reverse voltage applied between two terminals thereof. Therefore, the variable capacitance diode D1 is inserted into the oscillation loop and a voltage applied thereto is varied, thereby controlling an oscillation frequency.

However, if the quartz crystal resonator is to be miniaturized so as to correspond to miniaturization of a recent portable telephone, an information terminal or the like, an excitation electrode of a quartz crystal resonator element is reduced. Therefore, a capacitance of a package for the equivalent series capacitance C1 or a ratio of floating capacitances between electrodes increases, and, as a result, there is a problem in that the capacitance ratio $\gamma$ of the quartz crystal resonator increases, and thereby a desired frequency variable width cannot be obtained.

As a piezoelectric resonator capable of adjusting the frequency variable width, a piezoelectric resonator in which an inductor circuit pattern is provided in a package and an inductor L is connected to a piezoelectric resonator element accommodated in the package is disclosed in, for example, JP-A-2-226905. The inductor L which is inserted into the oscillation loop for this purpose is generally called an extension coil (or, simply a "coil"). This is based on a principle that, when the inductor L is connected in series to the piezoelectric resonator X1, a resonance frequency becomes lower than a frequency before the inductor L is inserted, but an antiresonance frequency does not vary, and thus an interval between the resonance frequency and the antiresonance frequency becomes spread.

However, in the piezoelectric resonator disclosed in JP-A-2-226905, a dedicated package in which the inductor circuit pattern is provided is necessary, and thus there is a problem in that a package does not have versatility.

SUMMARY

An advantage of some aspects of the invention is to solve at least a part of the problems described above and the invention can be implemented as the following forms or application examples.

Application Example 1

This application example is directed to a resonating element including a resonator element that includes a vibrating portion and an excitation electrode provided on both main surfaces of the vibrating portion; an intermediate substrate in which the resonator element is mounted so as to be spaced from the excitation electrode; and a spiral electrode pattern that is provided on the intermediate substrate, in which the electrode pattern is electrically connected to the excitation electrode.

According to this application example, when the resonating element has a structure in which the resonator element which is stably excited is mounted on the intermediate substrate, and is thus mounted in a package, the intermediate substrate reduces stress distortion due to a difference from a linear expansion coefficient of the package so as to obtain stable frequency-temperature characteristics. In addition, there is an effect of obtaining a desired frequency variable width in a case of forming an oscillator since an inductance is given by the spiral electrode pattern formed on the intermediate substrate even if a capacitance ratio γ increases according to miniaturization.

Application Example 2

This application example is directed to the resonating element according to the application example described above, wherein the electrode pattern and the excitation electrode are connected in series or in parallel to each other.

According to this application example, the series connection corresponds to inserting an inductor into an oscillation loop of the oscillator, and thereby there is an effect of increasing a frequency variable width. In addition, the parallel connection achieves an effect that it is possible to suppress influence of an unnecessary capacitance such as a floating capacitance between electrodes in the oscillator.

Application Example 3

This application example is directed to the resonating element according to the application example described above, wherein the electrode pattern and the excitation electrode are disposed so as not to overlap each other in plan view.

According to this application example, the excitation electrode and the electrode pattern for inductance do not overlap each other, and thereby it is possible to prevent adverse effects caused by a floating capacitance between electrodes of the excitation electrode and the electrode pattern for inductance from being exerted on oscillation characteristics.

Application Example 4

This application example is directed to the resonating element according to the application example described above, wherein the electrode patterns are provided on both main surfaces of the intermediate substrate, and the electrode patterns are connected in series to each other.

According to this application example, it is possible to make an inductance large and to thereby increase more effectively a frequency variable width since the length of the electrode patterns can increase without increasing the size of the intermediate substrate as compared with a case where an electrode pattern for inductance is provided only one main surface of the intermediate substrate.

Application Example 5

This application example is directed to the resonating element according to the application example described above, wherein the electrode pattern is provided on one main surface of both main surfaces of the intermediate substrate which are front and rear surfaces, a shield electrode is provided on the other main surface, and the other main surface is opposite to the excitation electrode.

According to this application example, the shield electrode is provided between the excitation electrode and the electrode pattern for inductance, and thereby it is possible to prevent adverse effects caused by a floating capacitance between electrodes of the excitation electrode and the electrode pattern for inductance from being exerted on oscillation characteristics.

Application Example 6

This application example is directed to the resonating element according to the application example described above, wherein the resonator element includes the vibrating portion; and an outer edge portion that is integrally formed with an outer edge of the vibrating portion and is thinner than the vibrating portion.

According to this application example, since the vibrating portion of the resonator element has a mesa structure, coupling with a spurious profile can be prevented, and thus vibration energy of only the main vibration can be confined. Therefore, it is possible to provide a resonating element in which CI is small and a spurious frequency around a resonance frequency is suppressed.

Application Example 7

This application example is directed to the resonating element according to the application example described above, wherein the resonator element includes the vibrating portion; and an outer edge portion that is integrally formed with an outer edge of the vibrating portion and is thicker than the vibrating portion.

According to this application example, since even a high frequency resonating element in which the vibrating portion of the resonator element is very thin can be mounted on the thick part which is integrally formed with the vibrating portion, it is possible to provide a resonating element with good resistance to impact or resistance to vibration.

Application Example 8

This application example is directed to a resonator including the resonating element according to the application example described above; and a package in which the resonating element is mounted by including the intermediate substrate mounted therein.

According to this application example, the resonating element is accommodated in the package, and thereby it is possible to prevent influence of disturbance such as a temperature variation, a humidity variation or influence due to contamination. Therefore, there is an effect that it is possible to provide a resonator which has good frequency reproducibility, frequency-temperature characteristics, CI-temperature characteristics, and frequency aging characteristics and has thus a large frequency variable width.

Application Example 9

This application example is directed to an electronic device including the resonating element according to the application example described above; a package in which the resonating element is mounted by including the intermediate substrate mounted therein; and an oscillation circuit that excites the vibrating portion.

According to this application example, since the resonating element having an inductance is used, there is an effect that it is possible to provide an electronic device such as a voltage controlled oscillator having good frequency-temperature characteristics and a large frequency variable width.

Application Example 10

This application example is directed to an electronic device including the resonating element according to the application example described above; a package in which the resonating element is mounted by including the intermediate substrate mounted therein; and an oscillation circuit that excites the vibrating portion, in which the shield electrode is connected to a ground terminal of the package.

According to this application example, when the quartz crystal resonating element which has the shield electrode between the excitation electrode and the electrode pattern for inductance is mounted in a package, the shield electrode of the quartz crystal resonating element is connected to a ground terminal of the oscillator, and thereby there is an effect that it is possible to prevent adverse effects caused by a floating capacitance between electrodes of the excitation electrode and the electrode pattern for inductance from being exerted on oscillation characteristics.

Application Example 11

This application example is directed to an electronic apparatus including the resonating element according to the application example described above.

According to this application example, there is an effect that an electronic apparatus having a favorable reference frequency source can be formed using the resonating element with good frequency-temperature characteristics.

Application Example 12

This application example is directed to a moving body including the resonating element according to the application example described above.

According to this application example, there is an effect that a stable reference frequency source can be formed, and thus a moving body including a stable and accurate electronic control unit can be formed, using the resonating element with good frequency-temperature characteristics.

BRIEF DESCRIPTION OF THE DRAWINGS

The invention will be described with reference to the accompanying drawings, wherein like numbers reference like elements.

FIGS. 1A and 1B are schematic diagrams illustrating a structure of a resonator element according to a first embodiment of the invention, in which FIG. 1A is a plan view when viewed from the top, and FIG. 1B is a cross-sectional view taken along the line A-A.

FIGS. 2A to 2C are schematic diagrams illustrating a structure of an intermediate substrate according to the first embodiment of the invention, in which FIG. 2A is a plan view when viewed from the top, FIG. 2B is a cross-sectional view taken along the line B-B, and FIG. 2C is a plan view when viewed from the bottom.

FIGS. 3A and 3B are schematic diagrams illustrating a structure of a resonating element according to the first embodiment of the invention, in which FIG. 3A is a plan view when viewed from the top, and FIG. 3B is a cross-sectional view taken along the line C-C.

FIGS. 4A and 4B are schematic diagrams illustrating a structure of a resonator according to the first embodiment of the invention, in which FIG. 4A is a plan view when viewed from the top, and FIG. 4B is a cross-sectional view taken along the line N-N.

FIGS. 5A and 5B are schematic diagrams illustrating a structure of an electronic device according to the first embodiment of the invention, in which FIG. 5A is a plan view when viewed from the top, and FIG. 5B is a cross-sectional view taken along the line D-D.

FIGS. 9A to 9C are schematic diagrams illustrating a structure of an intermediate substrate according to a second embodiment of the invention, in which FIG. 9A is a plan view when viewed from the top, FIG. 9B is a cross-sectional view taken along the line E-E, and FIG. 9C is a plan view when viewed from the bottom.

FIGS. 10A and 10B are schematic diagrams illustrating a structure of a resonating element according to the second embodiment of the invention, in which FIG. 10A is a plan view when viewed from the top, and FIG. 10B is a cross-sectional view taken along the line F-F.

FIGS. 11A to 11C are schematic diagrams illustrating a structure of an intermediate substrate according to a third embodiment of the invention, in which FIG. 11A is a plan view when viewed from the top, FIG. 11B is a cross-sectional view taken along the line G-G, and FIG. 11C is a plan view when viewed from the bottom.

FIGS. 12A and 12B are schematic diagrams illustrating a structure of a resonating element according to the third embodiment of the invention, in which FIG. 12A is a plan view when viewed from the top, and FIG. 12B is a cross-sectional view taken along the line H-H.

FIGS. 13A to 13C are schematic diagrams illustrating a structure of an intermediate substrate according to a fourth embodiment of the invention, in which FIG. 13A is a plan view when viewed from the top, FIG. 13B is a cross-sectional view taken along the line I-I, and FIG. 13C is a plan view when viewed from the bottom.

FIGS. 14A and 14B are schematic diagrams illustrating a structure of a resonating element according to the fourth embodiment of the invention, in which FIG. 14A is a plan view when viewed from the top, and FIG. 14B is a cross-sectional view taken along the line J-J.

FIGS. 15A and 15B are schematic diagrams illustrating a structure of an electronic device according to the fourth embodiment of the invention, in which FIG. 15A is a plan view when viewed from the top, and FIG. 15B is a cross-sectional view taken along the line K-K.

FIGS. 16A and 16B are schematic diagrams illustrating a structure of a resonator element according to a fifth embodiment of the invention, in which FIG. 16A is a plan view when viewed from the top, and FIG. 16B is a cross-sectional view taken along the line L-L.

FIGS. 17A and 17B are schematic diagrams illustrating a structure of a resonating element according to the fifth embodiment of the invention, in which FIG. 17A is a plan view when viewed from the top, and FIG. 17B is a cross-sectional view taken along the line M-M.

FIGS. 18A and 18B are schematic diagrams illustrating a structure of a resonator element according to a sixth embodiment of the invention, in which FIG. 18A is a plan view when viewed from the top, and FIG. 18B is a cross-sectional view taken along the line O-O.

FIGS. 19A and 19B are schematic diagrams illustrating a structure of a resonating element according to the sixth embodiment of the invention, in which FIG. 19A is a plan view when viewed from the top, and FIG. 19B is a cross-sectional view taken along the line P-P.

DESCRIPTION OF EXEMPLARY EMBODIMENTS

Hereinafter, embodiments of the invention will be described in detail with reference to the drawings.

Resonator Element

Figure 1A:
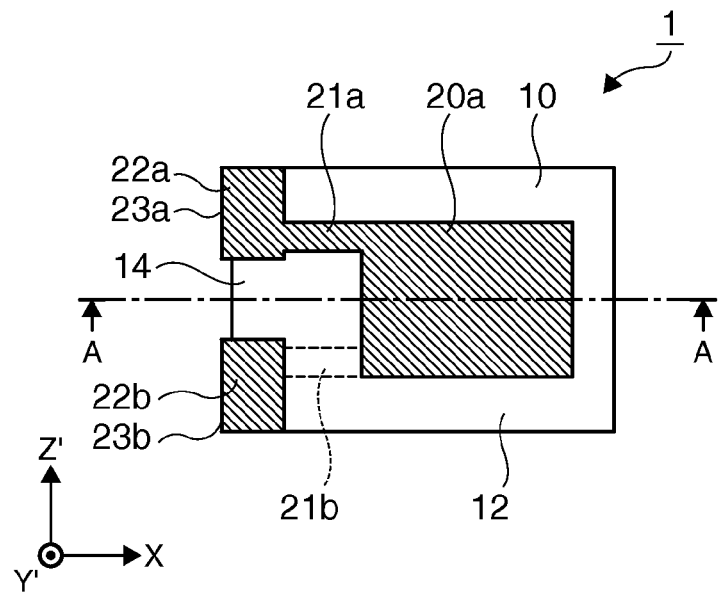
Figure 1B:
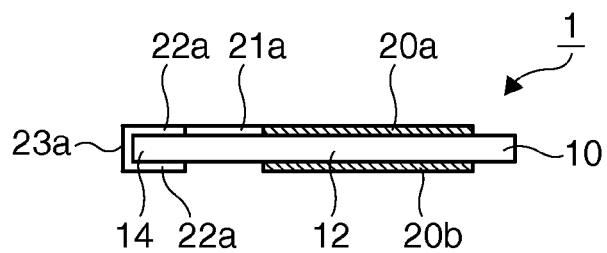

FIG. 1A is a schematic plan view when an example of a quartz crystal resonator element which is a resonator element according to a first embodiment of the invention is viewed from the top, and FIG. 1B is a cross-sectional view taken along the line A-A of FIG. 1A.

A quartz crystal resonator element 1 which is formed using a quartz crystal is formed using, for example, a quartz crystal wafer which is a single-crystalline substrate which is cut at a predetermined cut angle from a quartz crystal Lambert in which some of synthetic quartz crystal ore is formed on a block by clarifying a crystal axis (optical axis) thereof. Here, the predetermined cut angle indicates a cut angle which is tilted by a desired angle with respect to the crystal axis of the quartz crystal, and, in the present embodiment, a description will be made of the quartz crystal resonator element 1 which is formed using a so-called AT cut quartz crystal cut at a cut angle tilted by 35° 15' from the crystal axis and shows a thickness-shear vibration mode. The quartz crystal resonator element 1 using this AT cut quartz crystal is a piezoelectric resonator element with good temperature characteristics which can provide a stable frequency in a wide temperature region.

The quartz crystal resonator element 1 includes, as shown in FIG. 1A, a quartz crystal substrate 10, excitation electrodes 20a and 20b, and external connection terminals 22a and 22b. The quartz crystal substrate 10 includes a support portion 14 which is a fixed end (the left side of the quartz crystal resonator element 1 in FIGS. 1A and 1B) and a vibrating portion 12 which is a free end (one end (the right side of the quartz crystal resonator element 1 in FIGS. 1A and 1B) on a side of the quartz crystal resonator element 1 which is not fixed). The support portion 14 indicates a region between the vibrating portion 12 and the fixed end (the left side) of the quartz crystal resonator element 1. A pair of excitation electrodes 20a and 20b are provided so as to be opposite to each other on both main surfaces of the vibrating portion 12. In addition, the external connection terminals 22a and 22b which respectively correspond to the excitation electrodes 20a and 20b are provided on both main surfaces of the support portion 14, and the excitation electrodes 20a and 20b are respectively electrically connected to the corresponding to external connection terminals 22a and 22b via lead electrodes 21a and 21b. In addition, the external connection terminals 22a and 22b provided so as to be opposite to each other on both the main surfaces of the support portion 14 are respectively electrically connected to each other via side electrodes 23a and 23b.

The quartz crystal substrate 10 is etched so as to form an exterior of the quartz crystal resonator element 1, and, then, a metal film using, for example, gold (Au), is formed on a ground layer of, for example, nickel (Ni) or chrome (Cr) through deposition or sputtering and is subsequently patterned using photolithography, thereby forming the electrode pattern of the electrodes, the terminals, and the like.

In the embodiment shown in FIG. 1A, an example in which shapes of the excitation electrodes 20a and 20b are rectangular has been described, but shapes of the excitation electrodes 20a and 20b are not limited thereto and may be circular or elliptical.

Intermediate Substrate

Figure 2A:
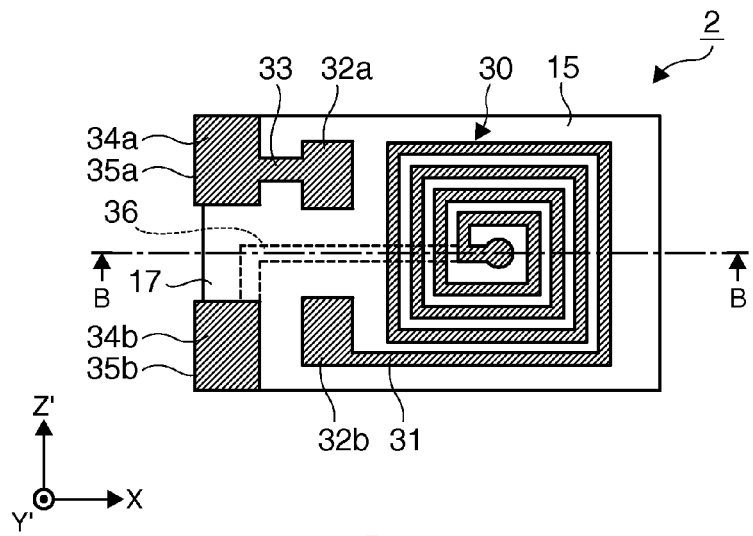
Figure 2B:
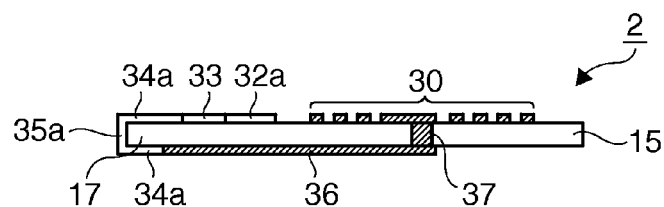
Figure 2C:
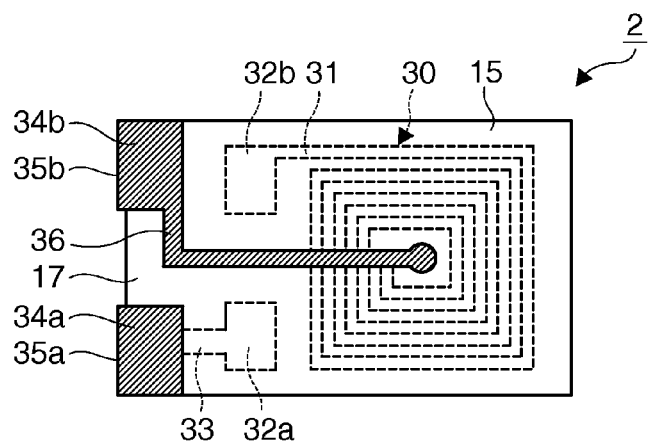

FIG. 2A is a schematic plan view when an intermediate substrate according to the first embodiment of the invention is viewed from the top, FIG. 2B is a cross-sectional view taken along the line B-B of FIG. 2B, and FIG. 2C is a schematic plan view when FIG. 2A is viewed from the bottom.

An intermediate substrate 2 includes, as shown in FIGS. 2A to 2C, a substrate 15, an electrode pattern 30 for inductance, terminals 32a and 32b for joining to the quartz crystal resonator element 1, and connection terminals 34a and 34b. The substrate 15 includes a base portion 17, a joining region to the quartz crystal resonator element 1, and an inductance forming region (a region in which the spiral electrode pattern 30 is formed) which are integrally formed in an arranged state on the plane. In addition, if the substrate 15 is formed of a quartz crystal substrate which is an insulating material and has the same cut angle as the quartz crystal resonator element 1, there is no difference in the linear expansion coefficient, and thus stress distortion caused by joining to the quartz crystal resonator element 1 does not occur, thereby obtaining stable frequency-temperature characteristics.

The base portion 17 is a portion which is fixed when a quartz crystal resonating element 3 in which the quartz crystal resonator element 1 overlaps the intermediate substrate 2 is joined to a package (refer to FIGS. 4A to 5B), and is provided with the connection terminals 34a and 34b used for electrical connection between the quartz crystal resonator element 1, the electrode pattern 30 for inductance, and the package. In addition, the connection terminals 34a and 34b which are provided so as to be opposite to each other on both main surfaces of the base portion 17 are respectively electrically connected to each other via side electrodes 35a and 35b.

As shown in FIG. 2A, one main surface of the substrate 15 is a surface on which the quartz crystal resonator element 1 is mounted, and is provided with the joining terminals 32a and 32b and the electrode pattern 30 for inductance. The connection terminal 34a is electrically connected to the terminal 32a for joining to the quartz crystal resonator element 1 via a lead electrode 33. In addition, the terminal 32b for joining to the quartz crystal resonator element 1 is electrically connected to the electrode pattern 30 for inductance via a lead electrode 31. The electrode pattern 30 for inductance is an inductor which is inserted into an oscillation loop of an oscillation circuit such as a quartz crystal oscillator and is generally called an extension coil or simply a coil. The electrode pattern 30 for inductance of the present embodiment is formed as a coil in which a thin and long wire is directed to the inner circumference from the outer circumference so as to have a rectangular spiral shape in the induction forming region on one main surface of the substrate 15. In addition, a shape of the electrode pattern 30 for inductance is not limited thereto, and may be a shape in which a distance from a start end to a finish end of an inductance pattern using a wire is as long as possible, for example, a typical spiral shape with an arc. Further, the electrode pattern 30 for inductance may be formed as a coil with a shape which is folded many times from one end part to the other part.

In addition, as shown in FIG. 2C, the other main surface of the substrate 15 is a surface on a side which is joined to a package in the quartz crystal resonator or the quartz crystal oscillator of the present embodiment (refer to FIGS. 4A to 5B). A lead electrode 36 is drawn out from the connection terminal 34*b* toward the inductance forming region, is led up to directly under the central end part of the electrode pattern 30 for inductance provided on one main surface, and is electrically connected to the electrode pattern 30 for inductance via an in-layer pattern 37 such as a through-hole. Thereby, a single inductor is formed by the electrode pattern 30 for inductance between the terminal 32*b* for joining to the quartz crystal resonator element 1 provided on one main surface in the base portion 17 of the substrate 15 and the connection terminal 34*b* provided in the base portion 17. In addition, in the present embodiment, in order to increase a frequency variable width of the oscillator, the quartz crystal resonator element 1 is connected in series to the electrode pattern 30 for inductance, the invention is not limited thereto, and the quartz crystal resonator element 1 may be connected in parallel to the electrode pattern 30 for inductance in order to suppress an unnecessary capacitance such as a floating capacitance between the respective electrodes in the oscillator.

Resonating Element

Next, a description will be made of a resonating element in which the quartz crystal resonator element 1 and the intermediate substrate 2 according to the present embodiment are stacked and are joined to each other with reference to the drawings.

Figure 3A:
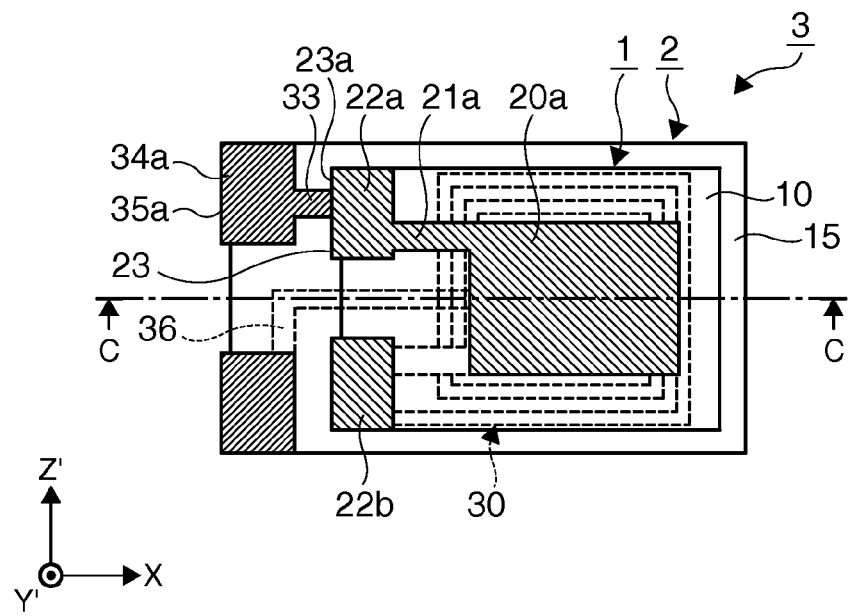
Figure 3B:
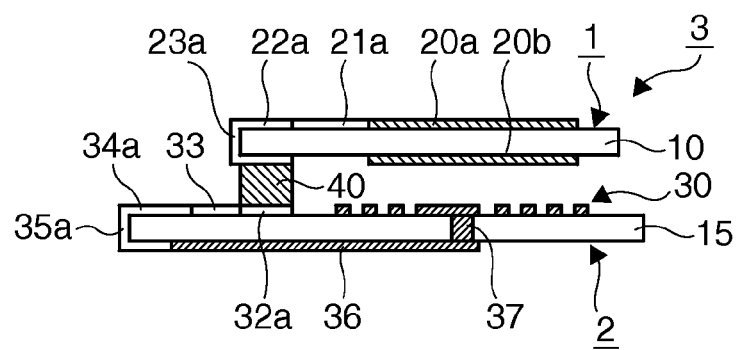

FIG. 3A is a schematic plan view when an example of a quartz crystal resonating element which is a resonating element according to the first embodiment of the invention is viewed from the top, and FIG. 3B is a cross-sectional view taken along the line C-C of FIG. 3A.

As shown in FIGS. 3A and 3B, the quartz crystal resonating element 3 is formed by mounting the quartz crystal resonator element 1 on the intermediate substrate 2. The terminals 32*a* and 32*b* for joining to the quartz crystal resonator element 1 provided on one main surface of the intermediate substrate 2 are aligned with the corresponding external connection terminals 22*a* and 22*b* and are joined thereto via a joining member 40. The joining member 40 uses a conductive joining member 40 such as a conductive adhesive or solder, and thereby mechanical joining can be performed along with electrical connection. In addition, the vibrating portion 12 of the quartz crystal resonator element 1 is disposed with a gap by the joining member 40 with respect to one main surface of the intermediate substrate 2 on which the electrode pattern 30 for inductance is formed.

In addition, if the substrate 15 of the intermediate substrate 2 is formed of a quartz crystal substrate having the same cut angle as the quartz crystal resonator element 1, there is no difference in the linear expansion coefficient, and stress distortion occurring when the quartz crystal resonator element 1 and the intermediate substrate 2 are stacked and are joined is small. Therefore, there is an effect that a resonating element having stable frequency-temperature characteristics can be obtained.

Resonator

Figure 4A:
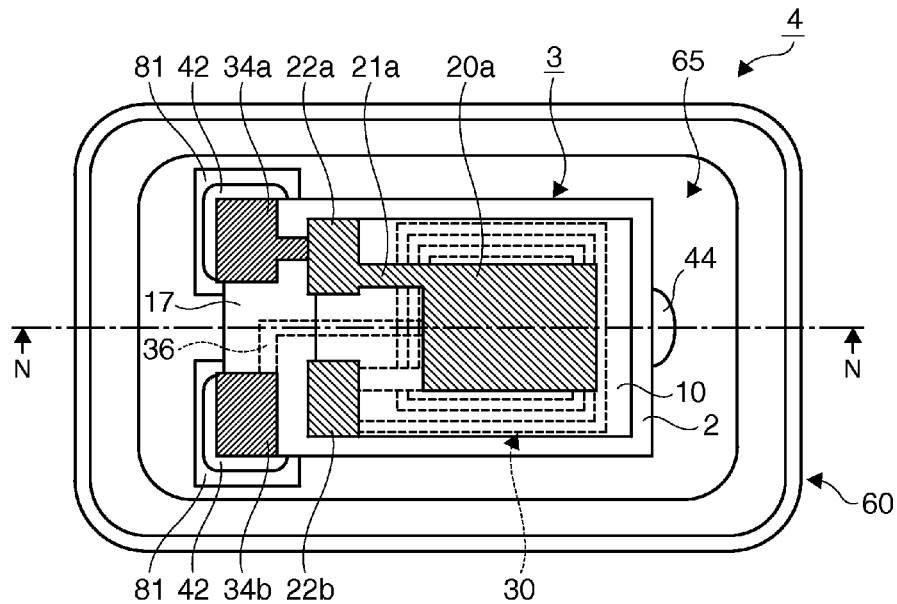
Figure 4B:
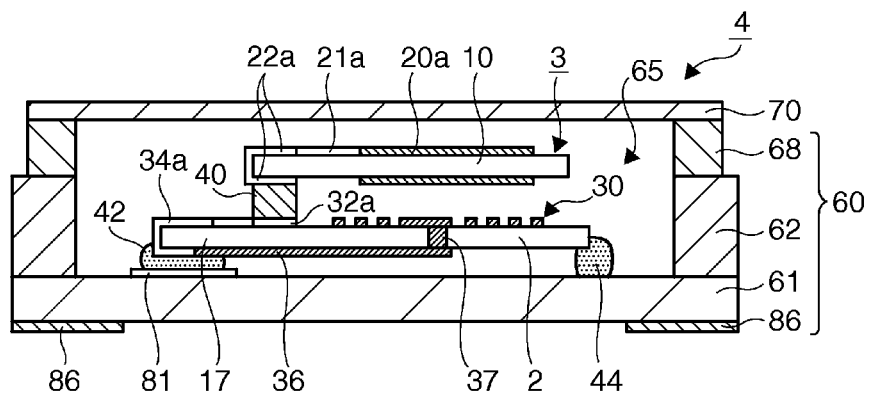

FIG. 4A is a schematic plan view when an example of a quartz crystal resonator which is a resonator according to the first embodiment of the invention is viewed from the top, and FIG. 4B is a cross-sectional view taken along the line N-N of FIG. 4A. In addition, in FIGS. 4A and 4B, for convenience of description of an inner configuration of the quartz crystal resonator, a state in which a lid member is removed is shown.

A quartz crystal resonator 4 includes the quartz crystal resonating element 3, a package main body 60 which is formed in a rectangular box shape so as to accommodate the quartz crystal resonating element 3, and a lid member 70 made of metal, ceramic, glass, or the like.

The package main body 60, as shown in FIG. 4B, is formed by stacking a first substrate 61, a second substrate 62, a sealing 68, and a mounting terminal 86. The mounting terminal 86 is formed in plurality on an outer bottom of the first substrate 61. The second substrate 62 is a ring-shaped body of which the center is removed, and the sealing 68 such as, for example, Kovar is formed on the upper rim of the second substrate 62.

A cavity 65 which accommodates the quartz crystal resonating element 3 is formed by the second substrate 62. A plurality of element mounting pads 81 which are electrically connected to the mounting terminals 86 by conductors (not shown) formed inside the first substrate 61 are provided at predetermined positions of the upper surface of the first substrate 61. The element mounting pads 81 are disposed so as to correspond to the connection terminals 34*a* and 34*b* formed in the base portion 17 of the intermediate substrate 2 when the quartz crystal resonating element 3 is placed.

The above-described first substrate 61 and second substrate 62 of the package main body 60 are made of a ceramic insulating material or the like. In addition, the respective electrodes, terminals, wire patterns or in-layer wire patterns electrically connecting the electrodes or the terminals to each other, or the like provided in the package main body 60 are generally formed by screen-printing a metal wire material such as tungsten (W) or molybdenum (Mo) on a ceramic insulating material so as to be baked at high temperature, and by performing plating such as nickel (Ni) or gold (Au) thereon.

If the quartz crystal resonating element 3 is to be supported and fixed (mounted), first, a joining member 42 and a joining member 44, for example, conductive adhesives are coated at positions corresponding to the element mounting pads 81 which correspond to the connection terminals 34*a* and 34*b* of the quartz crystal resonating element 3 and the end part (the right side of the quartz crystal resonating element 3 in FIGS. 4A and 4B) on the opposite side to the base portion 17 of the intermediate substrate 2 forming the quartz crystal resonating element 3, and a load is applied thereto by placing the connection terminals 34*a* and 34*b* of the quartz crystal resonating element 3 and the end part of the intermediate substrate 2 of the quartz crystal resonating element 3 thereon.

Next, the joining member 42 and the joining member 44 are put inside a high temperature furnace of a predetermined temperature for a predetermined time so as to be cured. The joining member 42 and the joining member 44 are cured and then undergo an annealing process, and a frequency is adjusted by adding the mass to the excitation electrode 20*a* or by reducing the mass. Thereafter, the lid member 70 is placed on the sealing 68 formed on the upper surface of the second substrate 62 of the package main body 60, and the lid member 70 is sealed through seam welding in vacuum or in a nitrogen gas atmosphere such that the quartz crystal resonator 4 is completed. Alternatively, there may be a method in which the lid member 70 is placed on low melting glass coated on the upper surface of the package main body 60 and is melted so as to be cohered. Also in this case, the cavity 65 of the package main body 60 is made to be vacuum, or is filled with an inert gas such as a nitrogen gas, thereby completing the quartz crystal resonator 4.

In addition, in the present embodiment, an example of using a conductive adhesive as the joining member 44 has been described, but, in a case where electrical connection is not necessary, a non-conductive adhesive may be used. Further, the end part on the opposite side to the connection terminals 34a and 34b of the quartz crystal resonating element 3 is joined in order to increase the mounting strength of the quartz crystal resonating element 3, but the invention is not limited thereto, and the end part may not be joined.

Electronic Device

Figure 5A:
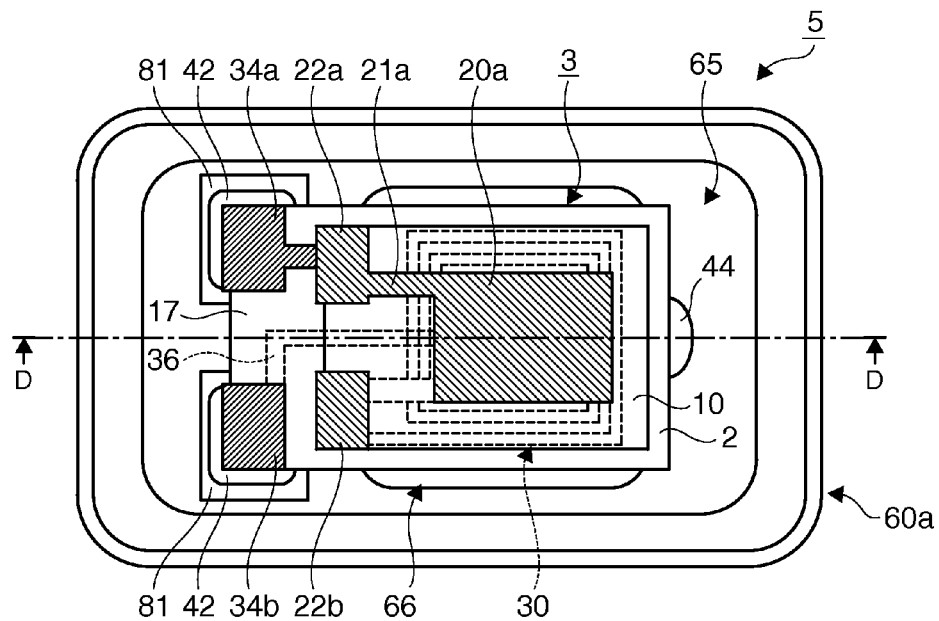
Figure 5B:
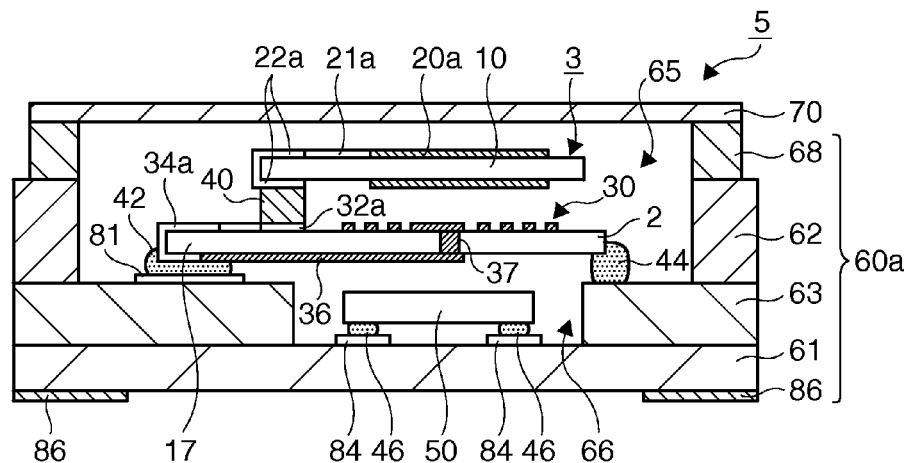

FIG. 5A is a schematic plan view when an example of a quartz crystal oscillator which is an electronic device according to the first embodiment of the invention is viewed from the top, and FIG. 5B is a cross-sectional view taken along the line D-D of FIG. 5A. In addition, in FIGS. 5A and 5B, for convenience of description of an inner configuration of the quartz crystal oscillator, a state in which the lid member is removed is shown.

A quartz crystal oscillator 5 includes a package main body 60a, the lid member 70, the quartz crystal resonating element 3, and an IC chip 50 in which an oscillation circuit exciting the quartz crystal resonating element 3 is mounted.

The quartz crystal oscillator 5 according to the present embodiment is a one-chip quartz crystal oscillator of a so-called Surface Mount Device (SMD) type in which the IC chip 50 including the quartz crystal resonator element 1 and the oscillation circuit is joined to the inner cavity 65 of the package main body 60a and is sealed, and surface mounting is possible. In addition, the SMD type quartz crystal oscillator 5 which is standardized as a surface mount part is advantageous to simplification of mounting processes or low costs, since it is not necessary to cut or mold a lead wire for external connection so as to conform with a connection terminal shape of an external substrate, and automation for mounting on an external substrate is easily performed, for example, unlike a type of quartz crystal resonator in which a quartz crystal resonator element joined to a substrate is covered with a cylindrical cap so as to be sealed.

As shown in FIG. 5B, the package main body 60a is formed by stacking a first substrate 61, a second substrate 62, a third substrate 63, a sealing 68, and a mounting terminal 86. The mounting terminal 86 is formed in plurality on the outer bottom of the first substrate 61. The second substrate 62 and the third substrate 63 are ring-shaped bodies of which the center is removed, and the sealing 68 such as Kovar is formed on the upper rim of the second substrate 62.

A cavity 65 which accommodates the quartz crystal resonating element 3 and a recess 66 which accommodates the IC chip 50 in which the oscillation circuit exciting the quartz crystal resonating element 3 is mounted are formed by the second substrate 62 and the third substrate 63. The upper surface of the first substrate 61 which is a bottom of the recess 66 is provided with a plurality of IC joining terminals 84 to which the IC chip 50 is connected. A plurality of element mounting pads 81 which are electrically connected to the mounting terminals 86 by conductors (not shown) formed inside the first substrate 61 and the third substrate 63 are provided at predetermined positions of the upper surface of the third substrate 63. The element mounting pads 81 are disposed so as to correspond to the connection terminals 34a and 34b formed in the base portion 17 of the intermediate substrate 2 when the quartz crystal resonating element 3 is placed.

The above-described first substrate 61 to the third substrate 63 of the package main body 60a are made of a ceramic insulating material or the like. In addition, the respective electrodes, terminals, wire patterns or in-layer patterns electrically connecting the electrodes or the terminals to each other, or the like, provided in the package main body 60a are generally formed by screen-printing a metal wire material such as tungsten (W) or molybdenum (Mo) on a ceramic insulating material so as to be baked at high temperature, and by performing plating such as nickel (Ni) or gold (Au) thereon.

In FIG. 5B, the IC chip 50 which is a semiconductor circuit element including an excitation circuit for exciting and resonating the quartz crystal resonator element 1 is joined to the IC joining terminals 84 provided at the bottom of the recess 66 of the package main body 60a, for example, using a brazing filler metal or an adhesive. In the present embodiment, the IC chip 50 is joined onto the IC joining terminals 84 in a face-down manner by bumps 46 which are made of a metal or a solder provided in electrode pad (not shown) of the IC chip 50 in advance. The joining of the IC chip 50 through the face-down joining is advantageous to thinning (low height) of the quartz crystal oscillator 5. In addition, after the IC chip 50 is joined in a face-down manner by the bumps 46, a gap between the IC chip 50 and the bottom of the recess 66 of the package main body 60a is filled with an under-filling material which is cured, so as to further increase the joining strength of the IC chip 50. Further, joining of the IC chip 50 to the package main body 60a is not limited to the face-down joining, and may be performed using other IC mounting techniques such as wire bonding.

The quartz crystal resonating element 3 in which the quartz crystal resonator element 1 is joined onto the intermediate substrate 2 is joined using conductive joining member 42 and joining member 44 such as conductive adhesives in the cavity 65 of the package main body 60a in a state in which the connection terminals 34a and 34b of the intermediate substrate 2 are aligned with the corresponding element mounting pads 81. In addition, positions or the number of the element mounting pads 81 are not limited to the aspect shown in FIGS. 5A and 5B, and may be appropriately varied depending on a connection relationship between the quartz crystal resonator element 1 and the electrode pattern 30 for inductance, and a connection relationship between the quartz crystal resonating element 3 and the IC chip 50. Further, a connection between the quartz crystal resonating element 3 and the element mounting pads 81 is also not limited to the face-down joining, and may be a connection using wire bonding, or may be a connection using a combination of the face-down joining and the wire bonding. Furthermore, direct wire bonding may be performed between the terminals 32a and 32b for joining to the quartz crystal resonator element 1 and the element mounting pads 81.

Figure 6:
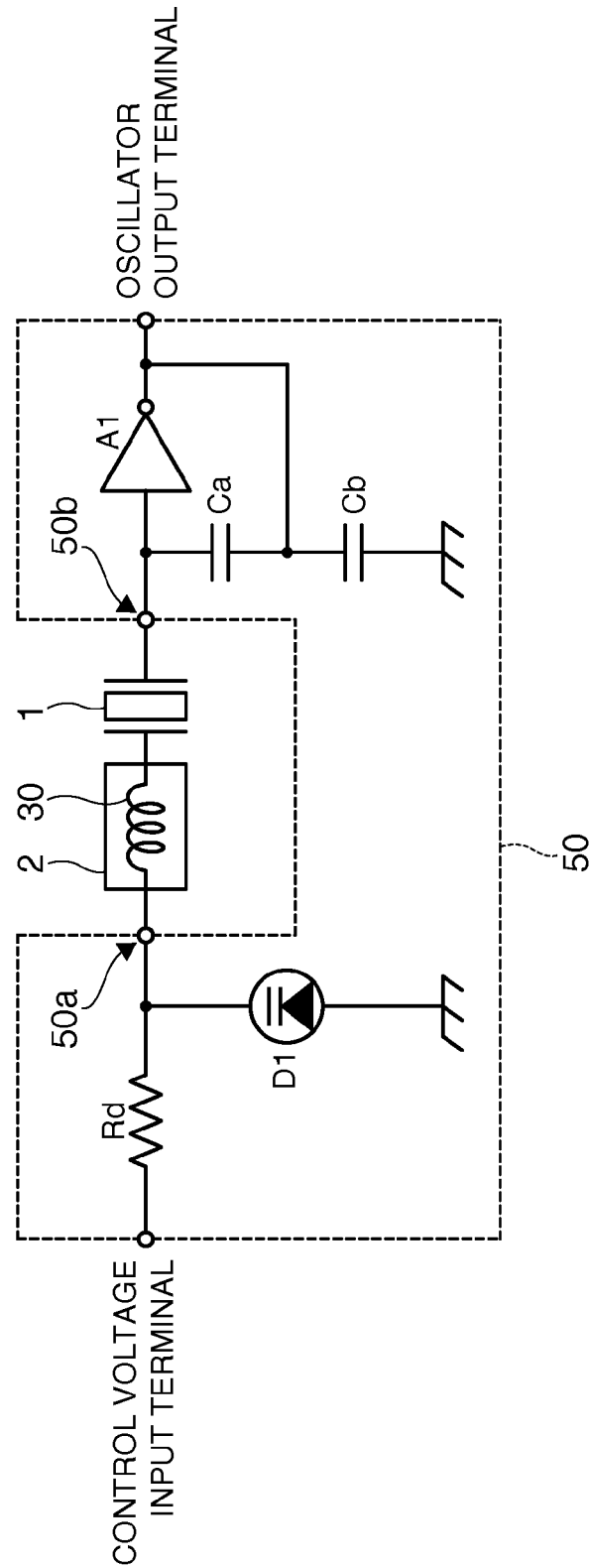
FIG. 6 is a circuit diagram illustrating an example of a circuit of an oscillator.
Figure 7:
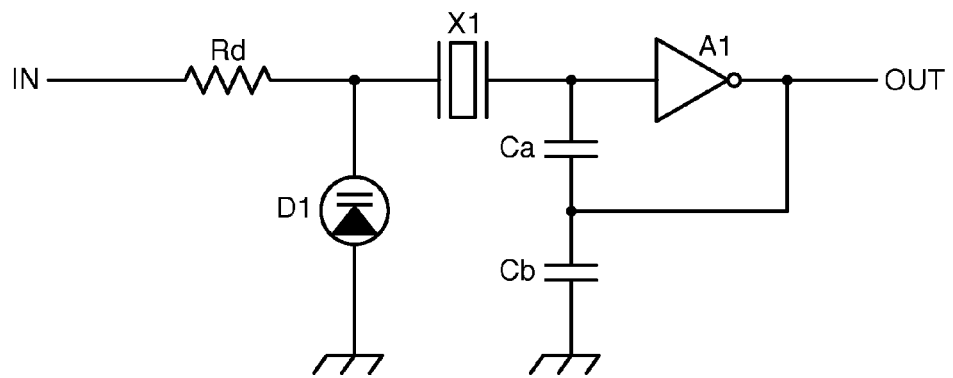
FIG. 7 is a circuit diagram illustrating an example of a voltage controlled quartz crystal oscillation circuit as an oscillator in the related art.
Figure 8:
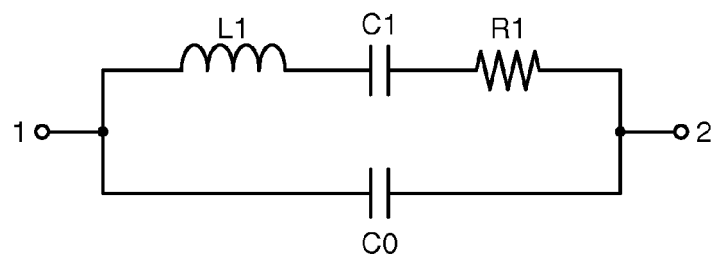
FIG. 8 is a circuit diagram illustrating an example of an equivalent circuit of a quartz crystal resonator.

Thereby, the IC chip 50 including oscillation circuit oscillating the quartz crystal resonator element 1 can be connected in series to the quartz crystal resonator element 1 via the electrode pattern 30 for inductance of the intermediate substrate 2 interposed therebetween. FIG. 6 is a circuit diagram illustrating an example of a circuit in which the electrode pattern 30 for inductance is interposed between the quartz crystal resonator element 1 and the IC chip 50 in the quartz crystal oscillator. As shown in FIG. 6, in the quartz crystal oscillator, the IC chip 50 includes terminals 50a and 50b, and, in the series circuit of the quartz crystal resonator element 1 and the electrode pattern 30 for inductance between the two terminals, the quartz crystal resonator element 1 may be connected to the terminal 50a and the electrode pattern 30 for inductance may be connected to the terminal 50b.

In addition, the quartz crystal resonator element 1 is disposed in the package main body 60a with the intermediate substrate 2 including the electrode pattern 30 for inductance interposed between the quartz crystal resonator element 1 and the IC chip 50.

In addition, of the joining member 42 and the joining member 44 used for joining between the quartz crystal resonating element 3 and the package main body 60a, the conductive joining member 42 may use a conductive adhesive or the like in which, for example, polyimide, or a resin such as a silicon-based or epoxy-based resin is mixed with silver (Ag) filament or nickel (Ni) powder.

The lid member 70 is joined onto the second substrate 62 of the package main body 60a in which the IC chip 50 and the quartz crystal resonating element 3 are joined together. Specifically, the lid member 70 which is made of a metal such as 42Alloy (an alloy in which nickel of 42% is contained in iron) or Kovar (an alloy of iron, nickel, and cobalt) is seam-welded via the sealing 68 which is formed by cutting a iron-nickel (Fe—Ni) alloy or the like in a frame shape. In addition, the lid member 70 may use ceramic, glass, or the like in addition to the above-described metal, and, for example, in a case where the lid member 70 made of glass is used, a joining member may be appropriately selected depending on a material of the lid member 70 such as using low melting glass as a joining member, and thereby the package main body 60a may be joined to the lid member 70.

The cavity 65 formed by the package main body 60a and the lid member 70 is a space for the quartz crystal resonator element 1 being operated. The cavity 65 may be sealed airtightly in a decompressed space or in an inert gas atmosphere in the quartz crystal oscillator 5 according to the present embodiment. For example, in a case where the cavity 65 is sealed airtightly in a compressed space, the quartz crystal oscillator 5 is placed in a vacuum chamber in a state in which a solid sealing material is disposed in a sealing hole (not shown) of the package main body 60a, and is decompressed up to a predetermined degree of vacuum so as to exhaust a gas emitted from inside of the quartz crystal oscillator 5 through the sealing hole, and then the solid sealing material is melted and is cured so as to close the sealing hole, thereby sealing the cavity 65. Thereby, the quartz crystal resonator element 1 and the IC chip 50 joined in the recess 66 of the package main body 60a can be airtightly sealed.

In addition, the sealing material preferably has, as a melting point, a temperature higher than a reflow temperature when the completed quartz crystal oscillator 5 is mounted on an external mounting substrate, and may use, for example, an alloy of gold and tin (Sn), an alloy of gold and germanium (Ge), or the like.

According to the quartz crystal oscillator 5 of the above-described embodiment, the IC chip 50 which is a semiconductor circuit element including the oscillation circuit and the electrode pattern 30 for inductance connected to the quartz crystal resonator element 1 which is a piezoelectric resonator element are provided inside the package main body 60a, and thus it is possible to provide the quartz crystal oscillator 5 which is a one-chip piezoelectric oscillator having high reliability and a large frequency variable width due to the one-seal structure.

Particularly, in the quartz crystal oscillator 5 of the above-described embodiment, the electrode pattern 30 for inductance is connected in series to the quartz crystal resonator element 1, and thus it is possible to more notably achieve an effect of increasing a frequency variable width by inserting an inductor into the oscillation loop of the quartz crystal oscillator 5.

In addition, since the quartz crystal resonator element 1 is mounted on the intermediate substrate 2 in which the electrode pattern 30 for inductance is formed, it is possible to provide the one-chip quartz crystal oscillator 5 of which oscillation characteristics are stable by using a general purpose package.

Further, since the intermediate substrate 2 in which the electrode pattern 30 for inductance is disposed between the IC chip 50 and the quartz crystal resonator element 1, the intermediate substrate 2 achieves a shield effect, and thus it is possible to suppress influence caused by a floating capacitance between the electrodes of the IC chip 50 and the quartz crystal resonator element 1 from being exerted on oscillation characteristics.

Modification Example 1 of Intermediate Substrate

Figure 9A:
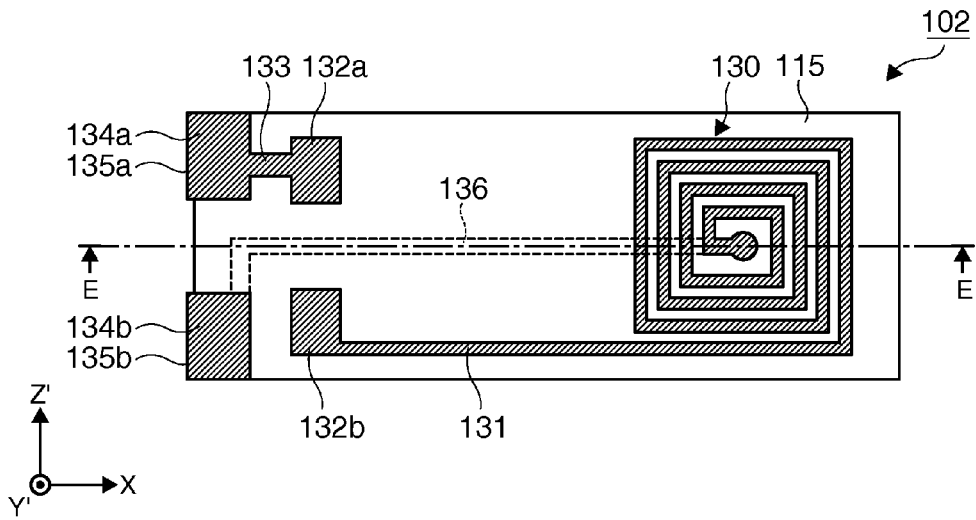
Figure 9B:
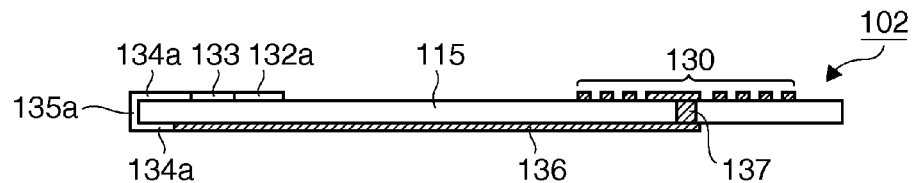
Figure 9C:
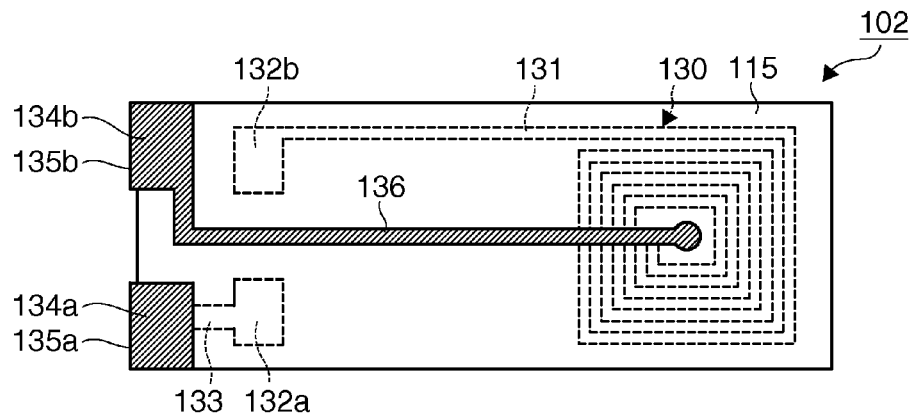

FIGS. 9A to 9C show a modification example of the intermediate substrate shown in FIGS. 2A to 2C, in which FIG. 9A is a schematic plan view when a structure of the intermediate substrate according to a second embodiment of the invention is viewed from the top, FIG. 9B is a cross-sectional view taken along the line E-E of FIG. 9A, and FIG. 9C is a schematic plan view when FIG. 9A is viewed from the bottom.

An intermediate substrate 102 according to the present modification example includes, as shown in FIGS. 9A to 9C, a substrate 115, an electrode pattern 130 for inductance, terminals 132a and 132b for joining to the quartz crystal resonator element 1, and connection terminals 134a and 134b, and has the same configuration as the intermediate substrate 2 of the embodiment shown in FIGS. 2A to 2C. However, a gap between the electrode pattern 130 for inductance and the terminals 132a and 132b for joining to the quartz crystal resonator element 1 is substantially the same length as the length of the quartz crystal resonator element 1.

One main surface of the substrate 115 is a surface on which the quartz crystal resonator element 1 is mounted, and is provided with the electrode pattern 130 for inductance, the joining terminals 132a and 132b, and the connection terminals 134a and 134b, which are respectively electrically connected to each other via lead electrodes 131 and 133. In addition, the other main surface of the substrate 115 is provided with the connection terminals 134a and 134b, and a lead electrode 136 is drawn out from the connection terminal 134b and is electrically connected to the electrode pattern 30 for inductance provided on one main surface via an in-layer wire 37 using a through-hole.

Since, in the intermediate substrate 102, a gap between the electrode pattern 130 for inductance and the terminals 132a and 132b for joining to the quartz crystal resonator element 1 is wide, in a case where a quartz crystal resonating element is formed by stacking and joining the quartz crystal resonator element 1 and the intermediate substrate 102, the excitation electrode 20b of the quartz crystal resonator element 1 and the electrode pattern 130 for inductance can be made not to overlap each other.

Modification Example 1 of Quartz Crystal Resonating Element

Figure 10A:
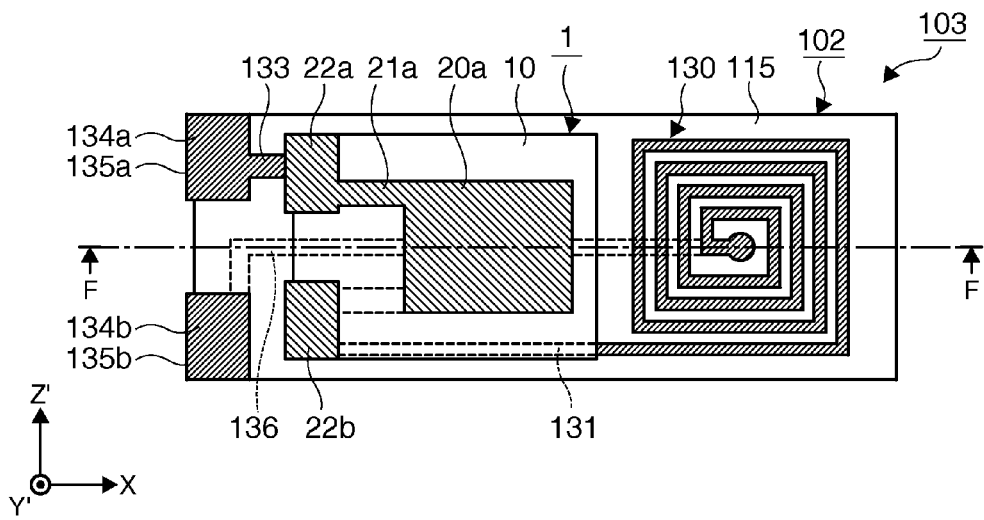
Figure 10B:
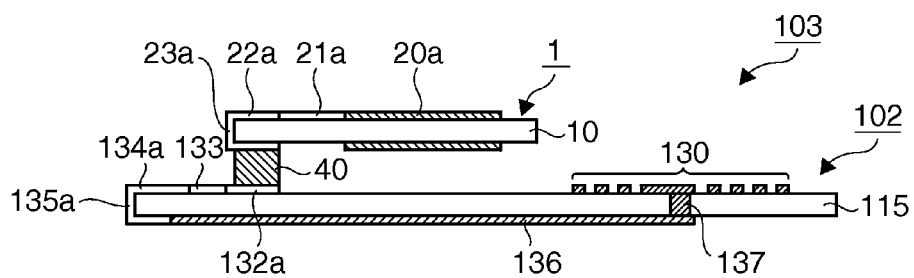

FIGS. 10A and 10B show a modification example of the quartz crystal resonating element, in which FIG. 10A is a schematic plan view when a structure of the quartz crystal resonating element according to the second embodiment of the invention is viewed from the top, and FIG. 10B is a cross-sectional view taken along the line F-F of FIG. 10A.

As shown in FIGS. 10A and 10B, a quartz crystal resonating element 103 according to the present modification example is formed by mounting the quartz crystal resonator element 1 on the intermediate substrate 102 which is a modification example of the intermediate substrate 2 of the embodiment shown in FIGS. 2A to 2C. The terminals 132*a* and 132*b* for joining to the quartz crystal resonator element 1 provided on one main surface of the intermediate substrate 102 are aligned with the corresponding external connection terminals 22*a* and 22*b* of the quartz crystal resonator element 1 and are joined thereto via a joining member 40. In addition, the vibrating portion 12 of the quartz crystal resonator element 1 is disposed with a gap by the joining member 40 with respect to one main surface of the intermediate substrate 102 on which the electrode pattern 130 for inductance is formed.

In the quartz crystal resonating element 103, a gap between the electrode pattern 130 for inductance and the terminals 132*a* and 132*b* for joining to the quartz crystal resonator element 1 provided on one main surface of the intermediate substrate 102 is wide. For this reason, in a case where the quartz crystal resonator element 1 is joined onto the intermediate substrate 102, the excitation electrode 20*b* of the quartz crystal resonator element 1 and the electrode pattern 130 for inductance do not overlap, and thus it is possible to prevent a floating capacitance between electrodes of the excitation electrode 20*b* and the electrode pattern 130 for inductance.

Modification Example 2 of Intermediate Substrate

Figure 11A:
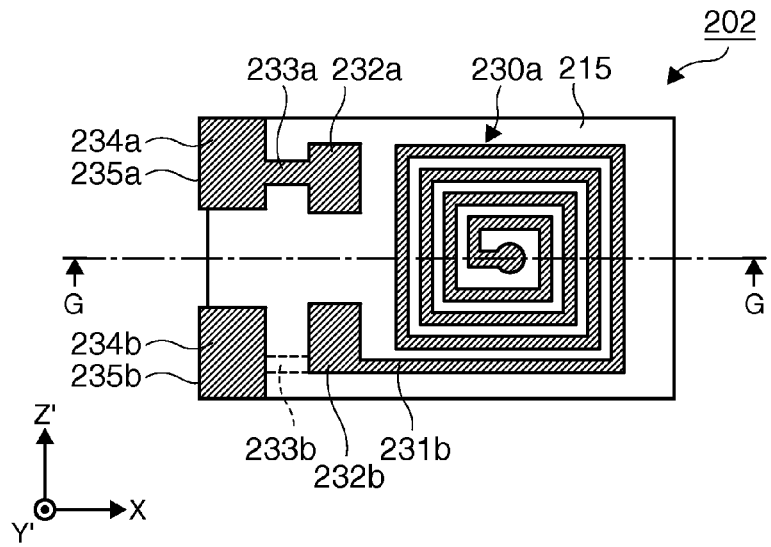
Figure 11B:
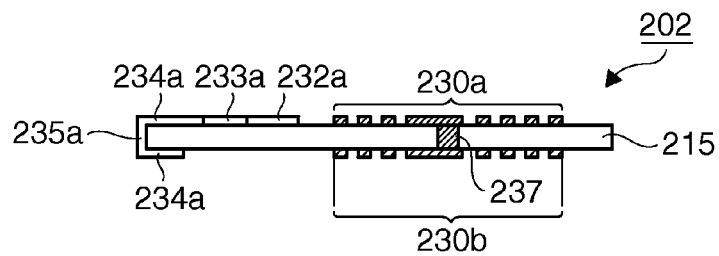
Figure 11C:
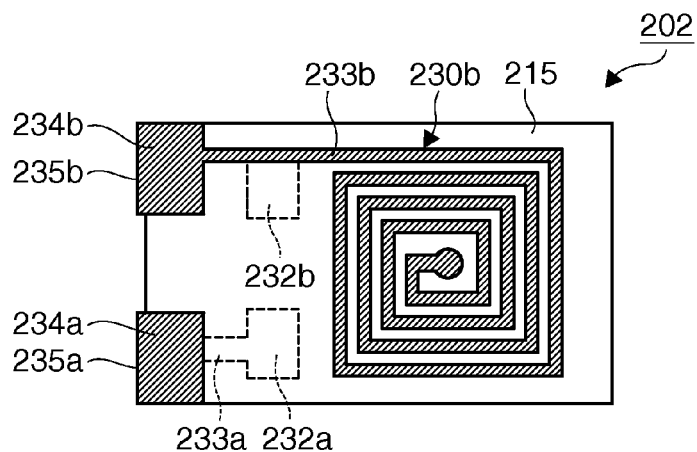

FIGS. 11A to 11C show a modification example of the intermediate substrate, in which FIG. 11A is a schematic plan view when a structure of the intermediate substrate according to a third embodiment of the invention is viewed from the top, FIG. 11B is a cross-sectional view taken along the line G-G of FIG. 11A, and FIG. 11C is a schematic plan view when FIG. 11A is viewed from the bottom.

As shown in FIG. 11A, in an intermediate substrate 202 according to the present modification example, a configuration of one main surface side of the substrate 215 is completely the same as the configuration of the intermediate substrate 2 of the embodiment shown in FIGS. 2A to 2C. In other words, the substrate 215 is provided with an electrode pattern 230*a* for inductance, terminals 232*a* and 232*b* for joining to the quartz crystal resonator element 1, and connection terminals 234*a* and 234*b*.

In addition, as shown in FIG. 11C, on the other main surface of the substrate 215, a lead electrode 233*b* is drawn out from the connection terminal 234*b* and is connected to an electrode pattern 230*b* for inductance which is formed in an inductance forming region.

The electrode pattern 230*b* for inductance formed on the other main surface is formed in the same shape and arrangement so as to overlap the electrode pattern 230*a* for inductance formed on one main surface in plan view. In this way, it is possible to suppress a defect such as reduction in frequency variable sensitivity due to canceling-out of inductances between the electrode patterns for inductance in a case where shapes or arrangements of the electrode patterns 230*a* and 230*b* for inductance on both main surfaces are misaligned, for example, in a case where winding directions of the rectangular spiral shapes are opposite to each other.

The electrode pattern 230*a* for inductance and the electrode pattern 230*b* for inductance formed on both main surfaces of the intermediate substrate 202 are electrically connected to each other at the center of the inductance forming region via an in-layer wire 237 such as a through-hole. Thereby, it is possible to provide the intermediate substrate 202 in which the two electrode patterns 230*a* and 230*b* for inductance are connected in series to each other between the terminal 232*b* for joining to the quartz crystal resonator element 1 provided on one main surface and the connection terminal 234*b* provided on the other main surface.

According to the intermediate substrate 202 of the present modification example, two electrode patterns 230*a* and 230*b* for inductance are connected in series to each other formed on both main surfaces of the intermediate substrate 202 are formed in a state of being connected in series to each other. Thereby, it is possible to increase an effect of increasing a frequency variable width by the electrode patterns 230*a* and 230*b* for inductance without increasing the size of the intermediate substrate as compared with a case where an electrode pattern for inductance is provided only one main surface of the intermediate substrate.

Modification Example 2 of Quartz Crystal Resonating Element

Figure 12A:
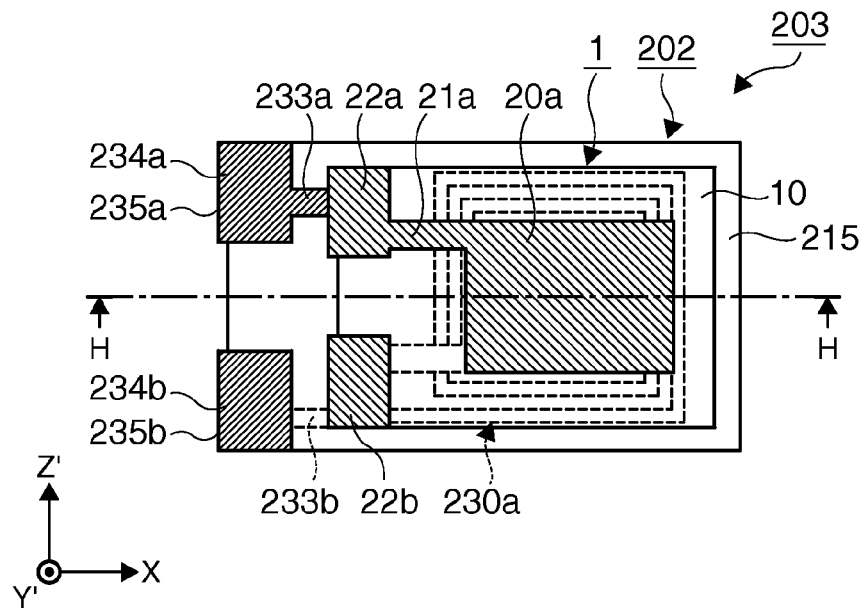
Figure 12B:
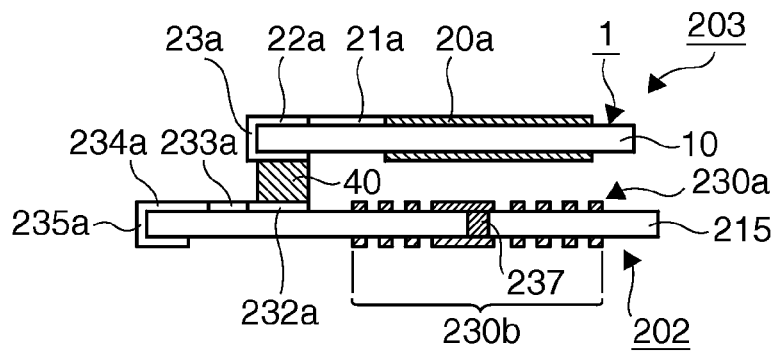

FIGS. 12A and 12B show a modification example of the quartz crystal resonating element, in which FIG. 12A is a schematic plan view when a structure of the quartz crystal resonating element according to a third embodiment of the invention is viewed from the top, and FIG. 12B is a cross-sectional view taken along the line H-H of FIG. 12A.

As shown in FIGS. 12A and 12B, a quartz crystal resonating element 203 according to the present modification example is formed by mounting the quartz crystal resonator element 1 on the intermediate substrate 202 which is a modification example of the intermediate substrate 2 of the embodiment shown in FIGS. 2A to 2C. The terminals 232*a* and 232*b* for joining to the quartz crystal resonator element 1 provided on one main surface of the intermediate substrate 202 are aligned with the corresponding external connection terminals 22*a* and 22*b* of the quartz crystal resonator element 1 and are joined thereto via a joining member 40. In addition, the vibrating portion 12 of the quartz crystal resonator element 1 is disposed with a gap by the joining member 40 with respect to one main surface of the intermediate substrate 202 on which the electrode pattern 230*a* for inductance is formed.

Since, in the quartz crystal resonating element 203, the electrode patterns 230*a* and 230*b* for inductance provided on both main surfaces of the intermediate substrate 202 are formed in a state of being connected in series to each other, it is possible to obtain a frequency variable width larger than in the quartz crystal resonating element 3 of the embodiment shown in FIGS. 3A and 3B.

Modification Example 3 of Intermediate Substrate

Figure 13A:
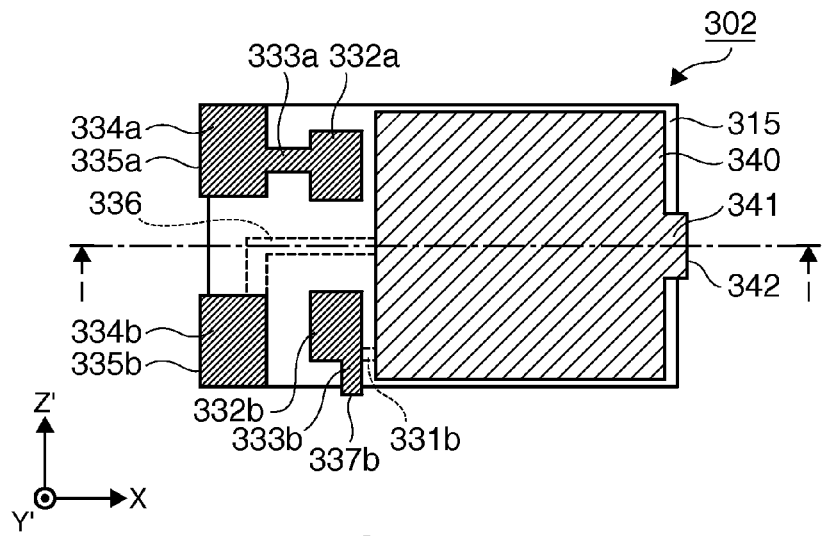
Figure 13B:
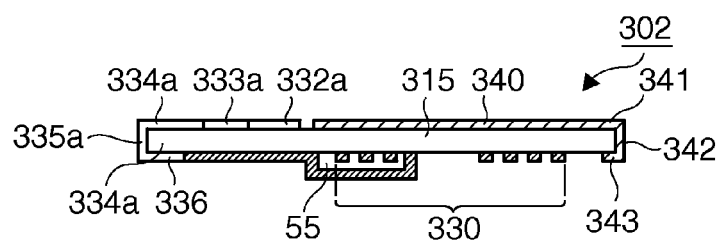
Figure 13C:
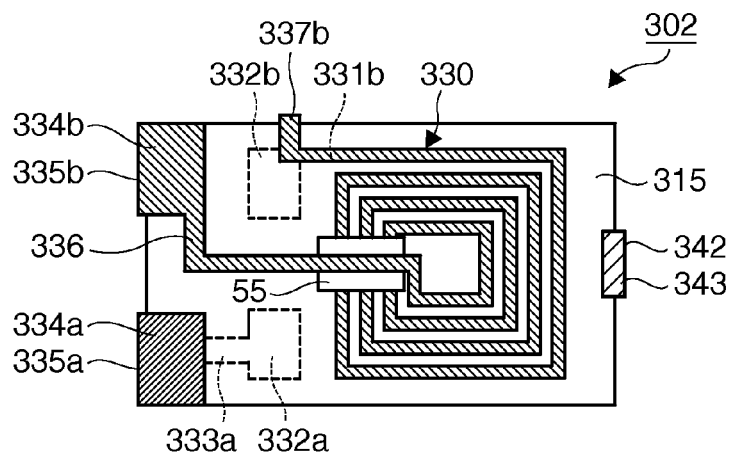

FIGS. 13A to 13C show a modification example of the intermediate substrate, in which FIG. 13A is a schematic plan view when a structure of the intermediate substrate according to a fourth embodiment of the invention is viewed from the top, FIG. 13B is a cross-sectional view taken along the line I-I of FIG. 13A, and FIG. 13C is a schematic plan view when FIG. 13A is viewed from the bottom.

An intermediate substrate 302 according to the present modification example includes, as shown in FIGS. 13A to 13C, a substrate 315, a shield electrode 340, terminals 332*a* and 332*b* for joining to the quartz crystal resonator element 1, connection terminals 334*a* and 334*b*, and an electrode pattern 330 for inductance.

One main surface of the substrate 315 is a surface on which the quartz crystal resonator element 1 is mounted, and is provided with the shield electrode 340, a pad electrode 341, the joining terminals 332*a* and 332*b*, the connection terminals 334*a* and 334*b*, and lead electrodes 333*a* and 333*b*.

The other main surface of the substrate 315 is provided with an electrode pattern 330 for inductance, a pad electrode 343, connection terminals 334a and 334b, and lead electrodes 331b and 336. The electrode pattern 330 for inductance and the connection terminal 334b are electrically connected to each other via the lead electrode 336. In addition, an insulating film 55, for example, a silicon oxide film is formed on the electrode pattern 330 for inductance so as to prevent the electrode pattern 330 for inductance and the lead electrode 336 from being short-circuited.

The connection terminals 334a and 334b, the lead electrodes 331b and 333b, and the pad electrodes 341 and 343, formed on both main surfaces of the substrate 315, are respectively electrically connected to each other via side electrodes 335a, 335b, 337b and 342.

Since, in the intermediate substrate 302, the shield electrode 340 is formed on the surface on which the quartz crystal resonator element 1 is mounted, in a case where a quartz crystal resonating element is formed by stacking and joining the quartz crystal resonator element 1 and the intermediate substrate 102, it is possible to prevent influence of a floating capacitance between electrodes of the excitation electrode 20b of the quartz crystal resonator element 1 and the electrode pattern 330 for inductance by using the shield electrode 340.

In addition, in the intermediate substrate 302 according to the present modification example, the joining terminals 332a and 332b are formed on the surface on which the shield electrode 340 is formed; however, the joining terminals 332a and 332b may be formed on the surface on which the electrode pattern 330 for inductance with a configuration of preventing a short circuit by using the insulating film 55 is formed.

In addition, in the same manner as the intermediate substrate 2 of the embodiment shown in FIGS. 2A to 2C, the electrode pattern 330 for inductance with a configuration of preventing a short circuit by using the insulating film 55 and the joining terminals 332a and 332b may be formed on the same surface, and the shield electrode 340 may not be formed.

Modification Example 3 of Quartz Crystal
Resonating Element

Figure 14A:
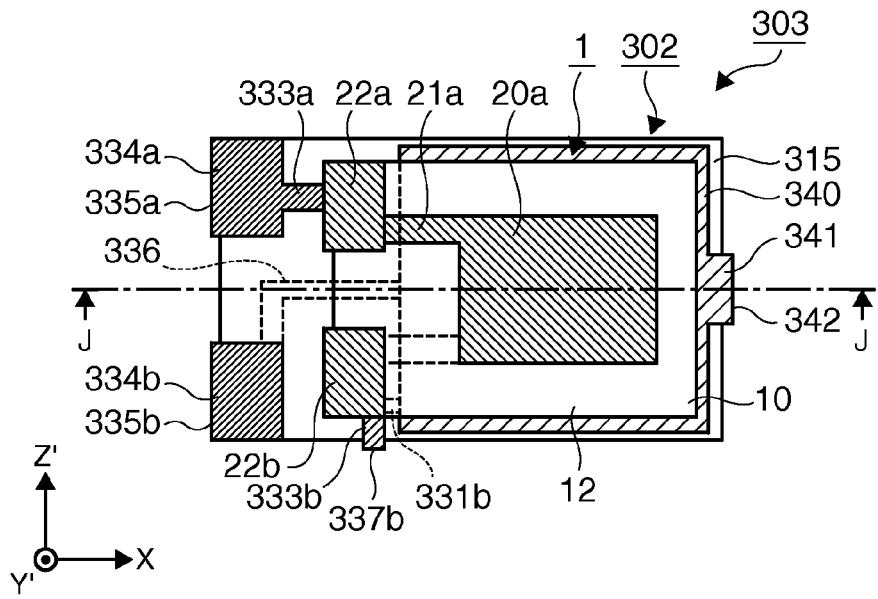
Figure 14B:
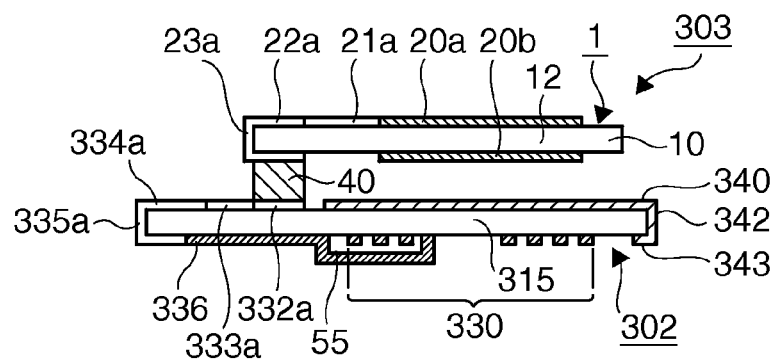

FIGS. 14A and 14B show a modification example of the quartz crystal resonating element, in which FIG. 14A is a schematic plan view when a structure of the quartz crystal resonating element according to the fourth embodiment of the invention is viewed from the top, and FIG. 14B is a cross-sectional view taken along the line J-J of FIG. 14A.

As shown in FIGS. 14A and 14B, a quartz crystal resonating element 303 according to the present modification example is formed by mounting the quartz crystal resonator element 1 on the intermediate substrate 302 which is a modification example of the intermediate substrate 2 of the embodiment shown in FIGS. 2A to 2C. The terminals 332a and 332b for joining to the quartz crystal resonator element 1 provided on one main surface of the intermediate substrate 302 are aligned with the corresponding external connection terminals 22a and 22b of the quartz crystal resonator element 1 and are joined thereto via a joining member 40. In addition, the vibrating portion 12 of the quartz crystal resonator element 1 is disposed with a gap by the joining member 40 with respect to one main surface of the intermediate substrate 302 on which a shield electrode 340 is formed.

Since, in the quartz crystal resonating element 303, the shield electrode 340 is formed on the surface of the intermediate substrate 302 on which the quartz crystal resonator element 1 is mounted, it is possible to prevent adverse effects caused by a floating capacitance between electrodes of the excitation electrode 20b of the quartz crystal resonator element 1 and the electrode pattern 330 for inductance from being exerted on oscillation characteristics.

Further, if an intermediate substrate (not shown) in which the joining terminals 332a and 332b are formed on a surface on which the electrode pattern 330 for inductance with a configuration of preventing a short circuit by using the insulating film 55 is formed is used in the quartz crystal resonating element 303 of the present modification example, the electrode pattern 330 for inductance is formed on the surface on which the quartz crystal resonator element 1 is mounted, and the shield electrode 340 is formed on the surface opposite to the IC chip 50. Therefore, in a case of forming a quartz crystal oscillator, it is possible to prevent adverse effects caused by a floating capacitance between electrodes of the electrode pattern 330 for inductance and the IC chip 50 from being exerted on oscillation characteristics.

Further, if a quartz crystal resonating element is formed using an intermediate substrate (not shown) in which the electrode pattern 330 for inductance with a configuration of preventing a short circuit by using the insulating film 55 and the joining terminals 332a and 332b are formed on the same surface and the shield electrode 340 is not formed, and is used in a quartz crystal oscillator, it is possible to obtain characteristics equivalent to the quartz crystal oscillator 5 of the embodiment shown in FIGS. 5A and 5B.

Modification Example 1 of Quartz Crystal Oscillator

Figure 15A:
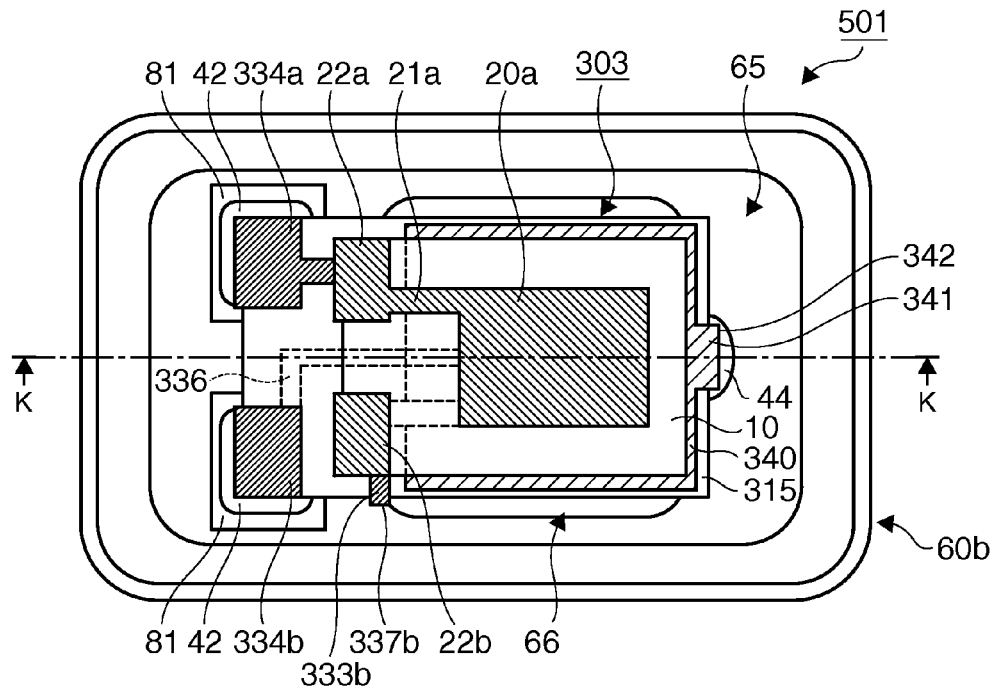
Figure 15B:
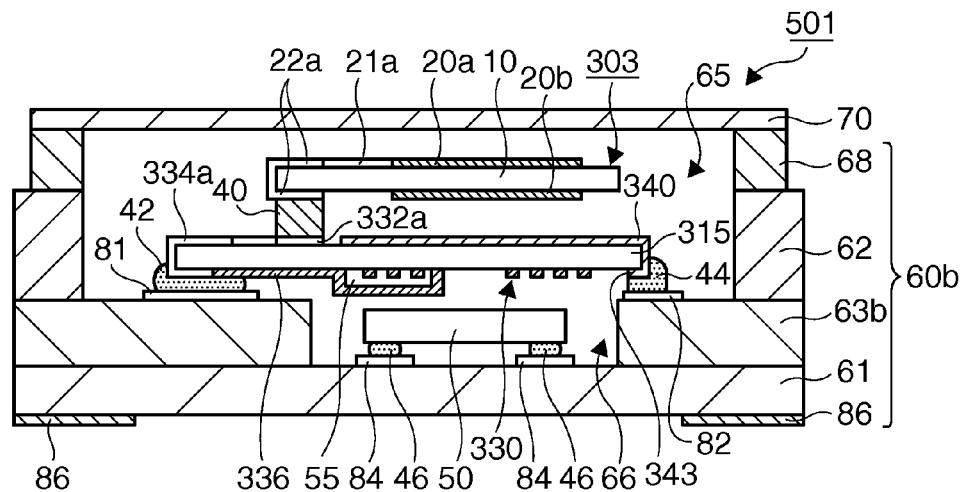

FIGS. 15A and 15B show a modification example of the quartz crystal oscillator, in which FIG. 15A is a schematic plan view when a structure of a quartz crystal oscillator according to the fourth embodiment of the invention is viewed from the top, and FIG. 15B is a cross-sectional view taken along the line K-K of FIG. 15A. In addition, in FIGS. 15A and 15B, for convenience of description of an inner configuration of the quartz crystal oscillator, a state in which the lid member is removed is shown.

In a quartz crystal oscillator 501 which is the present modification example, as shown in FIGS. 15A and 15B, the quartz crystal resonating element 303 which is a modification example of the quartz crystal resonating element 3 of the embodiment shown in FIGS. 3A and 3B is mounted, and thus the quartz crystal oscillator 501 is different from the quartz crystal oscillator 5 of the embodiment shown in FIGS. 5A and 5B in a partial configuration of a package main body 60b. In addition, description of the same configuration as the quartz crystal oscillator 5 of the embodiment shown in FIGS. 5A and 5B will be omitted.

The quartz crystal oscillator 501 includes a package main body 60b, a lid member 70, the quartz crystal resonating element 303, and an IC chip 50 in which an oscillation circuit exciting the quartz crystal resonating element 303 is mounted.

In the package main body 60b, an element mounting pad 82 is formed on an upper surface of a third substrate 63b in order to electrically connect a shield electrode 340 provided on the intermediate substrate 302 of the quartz crystal resonating element 303 to a ground terminal which is one of mounting terminals 86 of the package main body 60b. In addition, the mounting terminal 86 which is the ground terminal and the element mounting pad 82 are electrically connected to each other via conductors (not shown) formed inside the first substrate 61 and the third substrate 63b. The element mounting pads 81 are disposed so as to correspond to the connection terminals 334a and 334b formed on the intermediate substrate 302 when the quartz crystal resonating element 303 is placed, and the element mounting pad 82 is disposed so as to correspond to a pad electrode 343 formed on the intermediate substrate 302 when the quartz crystal resonating element 303 is placed.

The quartz crystal resonating element 303 is joined to the element mounting pads 81 and 82 of the package main body 60b by using conductive joining member 42 and joining member 44 such as conductive adhesives in a state in which the connection terminals 334a and 334b are aligned with the pad electrode 343.

The quartz crystal oscillator 501 in which the quartz crystal resonating element 303 having the shield electrode 340 is mounted can prevent a floating capacitance between electrodes of the excitation electrode 20b of the quartz crystal resonator element 1 and the electrode pattern 330 for inductance or the excitation electrode 20b of the quartz crystal resonator element 1 and the IC chip 50, and thus has stable oscillation characteristics. Therefore, it is possible to provide a quartz crystal oscillator with a large frequency variable width.

Modification Example 1 of Quartz Crystal Resonator Element

Figure 16A:
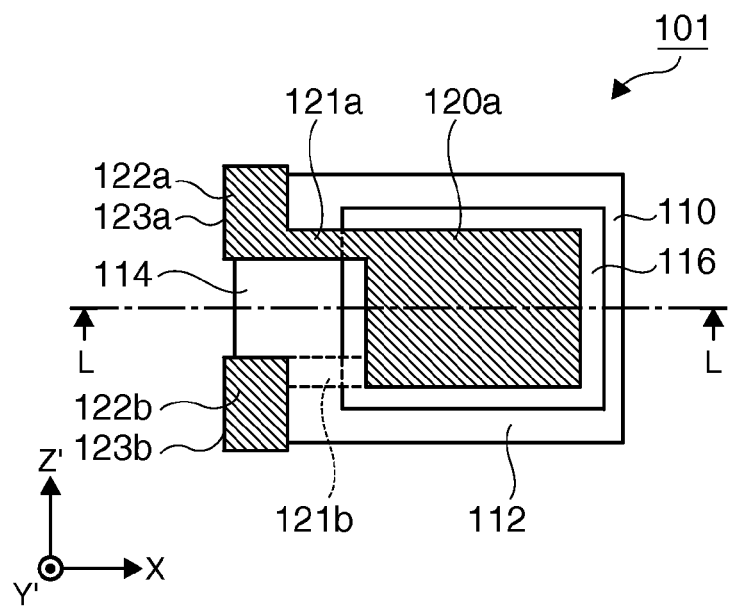
Figure 16B:
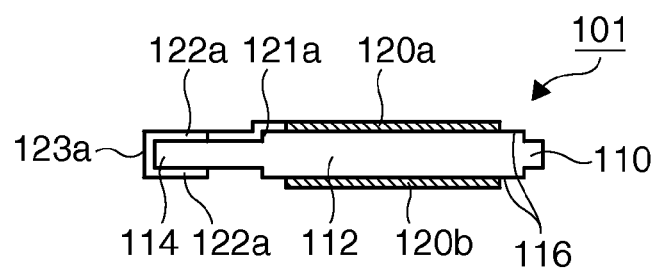

FIGS. 16A and 16B show a modification example of the quartz crystal resonator element, in which FIG. 16A is a schematic plan view when a structure of a quartz crystal resonator element according to a fifth embodiment of the invention is viewed from the top, and FIG. 16B is a cross-sectional view taken along the line L-L of FIG. 16A.

A quartz crystal resonator element 101 which is a modification example of the quartz crystal resonator element 1 of the embodiment shown in FIGS. 1A and 1B includes, as shown in FIG. 16A, a quartz crystal substrate 110, excitation electrodes 120a and 120b, and external connection terminals 122a and 122b. The quartz crystal substrate 110 includes a support portion 114 which is a fixed end and a vibrating portion 112 which is a free end. Here, the vibrating portion 112 according to the present modification example indicates a region which is interposed between mesa portions 116 formed on both main surfaces of the quartz crystal substrate 110. In addition, the support portion 114 indicates a region between the vibrating portion 112 and the fixed end (the left side) of the quartz crystal resonator element 101. A pair of excitation electrodes 120a and 120b are provided so as to be opposite to each other on both main surfaces of the vibrating portion 112. In addition, the external connection terminals 122a and 122b which respectively correspond to the excitation electrodes 120a and 120b are provided on both main surfaces of the support portion 114, and the excitation electrodes 120a and 120b are respectively electrically connected to the corresponding external connection terminals 122a and 122b via lead electrodes 121a and 121b. In addition, the external connection terminals 122a and 122b provided so as to be opposite to each other on both the main surfaces of the support portion 114 are respectively electrically connected to each other via side electrodes 123a and 123b.

Since the quartz crystal resonator element 101 has a mesa structure in which the mesa portions 116 are formed on both main surfaces of the quartz crystal substrate 110, coupling with a spurious profile can be prevented, and thus vibration energy of only the main vibration can be confined. Therefore, it is possible to reduce CI and to thereby suppress a spurious frequency around a resonance frequency.

Modification Example 4 of Quartz Crystal Resonating Element

Figure 17A:
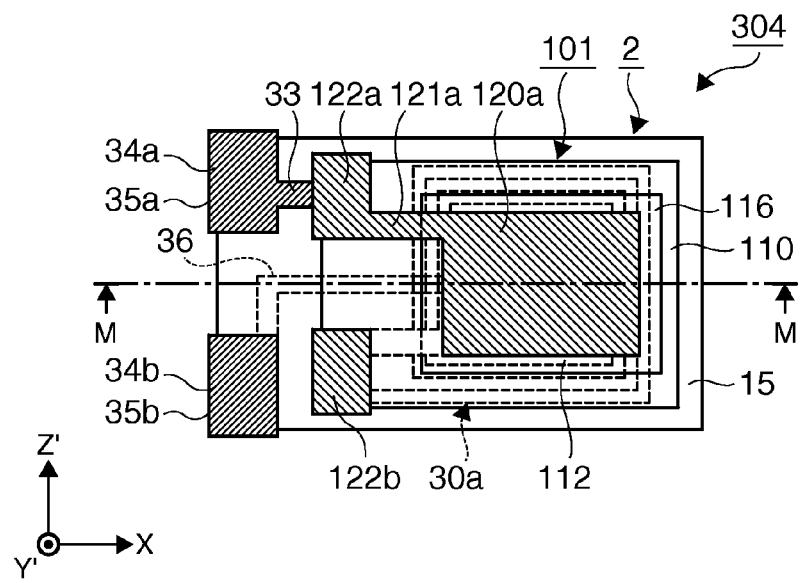
Figure 17B:
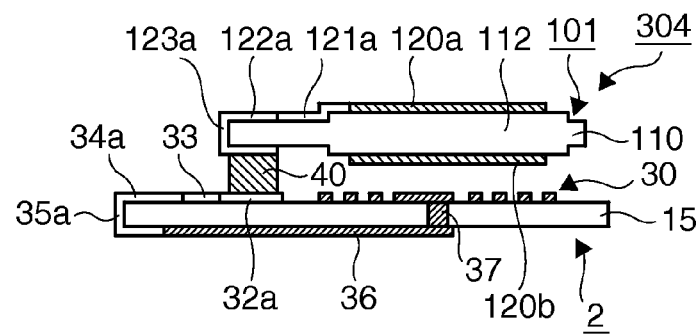

FIGS. 17A and 17B show a modification example of the quartz crystal resonating element, in which FIG. 17A is a schematic plan view when a structure of the quartz crystal resonating element according to the fifth embodiment of the invention is viewed from the top, and FIG. 17B is a cross-sectional view taken along the line M-M of FIG. 17A.

As shown in FIGS. 17A and 17B, a quartz crystal resonating element 304 according to the present modification example is formed by mounting a quartz crystal resonator element 101 which is a modification example of the quartz crystal resonator element 1 of the embodiment shown in FIGS. 1A and 1B on the intermediate substrate 2. The terminals 32a and 32b for joining to the quartz crystal resonator element 101 provided on one main surface of the intermediate substrate 2 are aligned with the corresponding external connection terminals 122a and 122b of the quartz crystal resonator element 101 and are joined thereto via a joining member 40. In addition, the vibrating portion 112 of the quartz crystal resonator element 101 is disposed with a gap by the joining member 40 with respect to one main surface of the intermediate substrate 2 on which the electrode pattern 30 for inductance is formed.

Since, in the quartz crystal resonating element 304, the mesa portions 116 are formed in the vibrating portion 112 of the quartz crystal resonator element 101, coupling with a spurious profile can be prevented, and thus vibration energy of only the main vibration can be confined. Therefore, it is possible to provide a resonating element in which CI is small and a spurious frequency around a resonance frequency is suppressed.

Modification Example 2 of Quartz Crystal Resonator Element

Figure 18A:
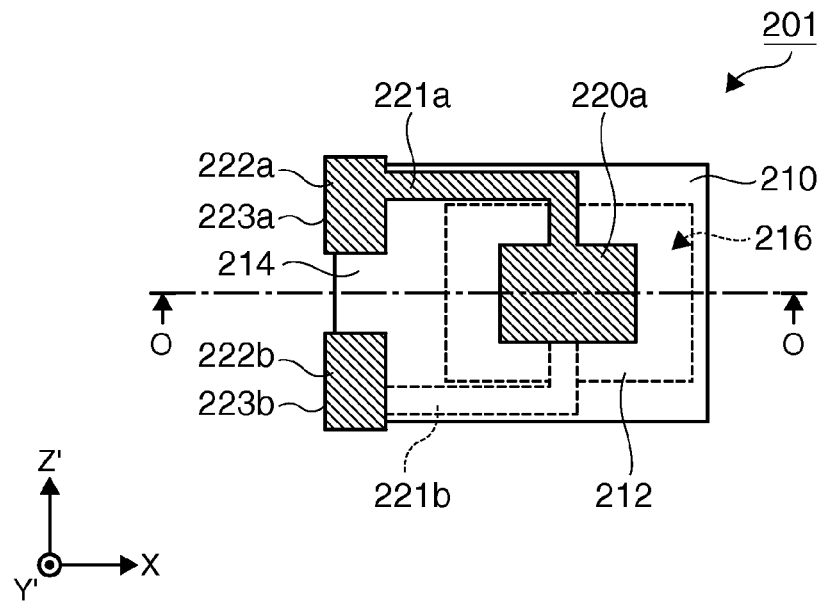
Figure 18B:
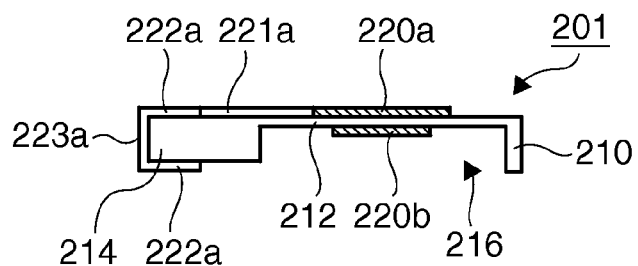

FIGS. 18A and 18B show a modification example of the quartz crystal resonator element, in which FIG. 18A is a schematic plan view when a structure of a quartz crystal resonator element according to a sixth embodiment of the invention is viewed from the top, and FIG. 18B is a cross-sectional view taken along the line O-O of FIG. 18A.

A quartz crystal resonator element 201 which is a modification example of the quartz crystal resonator element 1 of the embodiment shown in FIGS. 1A and 1B includes, as shown in FIG. 18A, a quartz crystal substrate 210, excitation electrodes 220a and 220b, and external connection terminals 222a and 222b. The quartz crystal substrate 210 includes a support portion 214 which is a fixed end and a vibrating portion 212 which is a free end. Here, the vibrating portion 212 according to the present modification example indicates a region which is interposed between a bottom of a recess 216 formed on one main surface of the quartz crystal substrate 210 and a main surface on aside where the recess 216 is not formed. In addition, the support portion 214 is the thick portion interposed between both main surfaces of the quartz crystal substrate 210 and indicates a region between the vibrating portion 212 and the fixed end (the left side) of the quartz crystal resonator element 201. A pair of excitation electrodes 220a and 220b are provided so as to be opposite to each other on both main surfaces of the vibrating portion 212. In addition, the external connection terminals 222a and 222b which respectively correspond to the excitation electrodes 220a and 220b are provided on both main surfaces of the support portion 214, and the excitation electrodes 220a and 220b are respectively electrically connected to the corresponding external connection terminals 222a and 222b via lead electrodes 221a and 221b. In addition, the external connection terminals 222a and 222b provided so as to be opposite to each other on both the main surfaces of the support portion 214 are respectively electrically connected to each other via side electrodes 223a and 223b.

Since the quartz crystal resonator element 201 has a reverse mesa structure in which the recess 216 is formed in the vibrating portion 212, the vibrating portion 212 can be made to be very thin so as to achieve a high frequency. In addition, since mounting is performed on the thick part which is integrally formed with the vibrating portion 212, good resistance to impact or resistance to vibration can be expected.

Modification Example 5 of Quartz Crystal Resonating Element

Figure 19A:
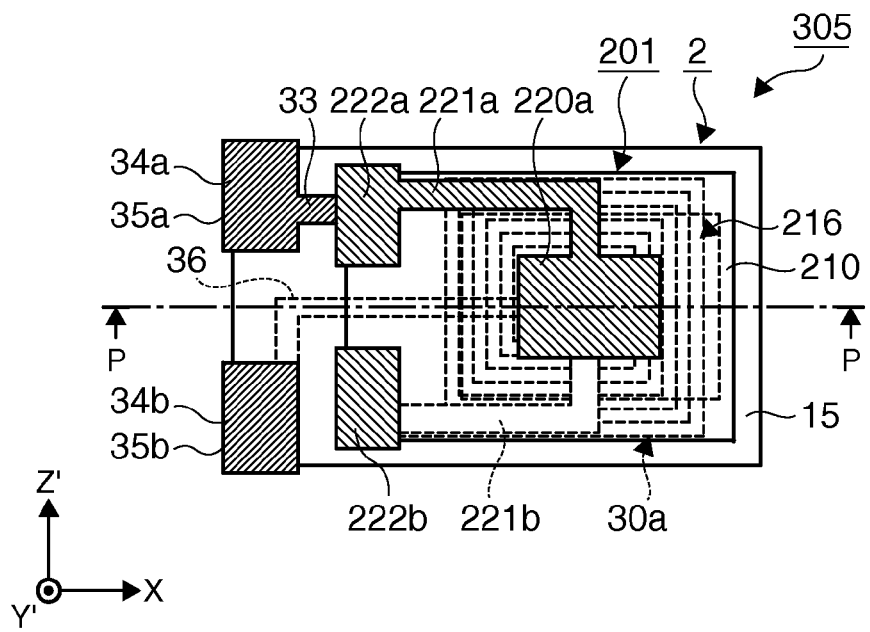
Figure 19B:
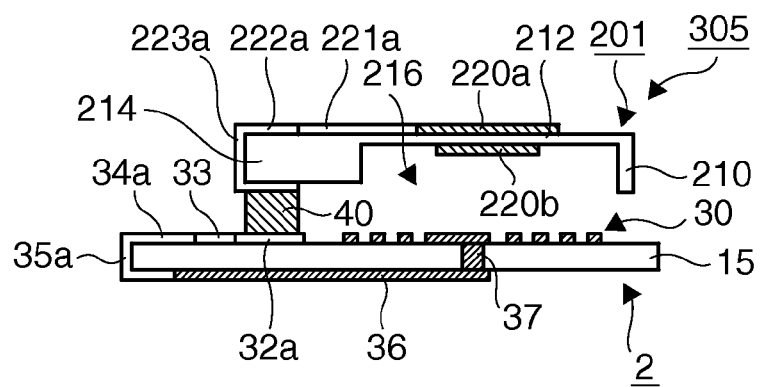

FIGS. 19A and 19B show a modification example of the quartz crystal resonating element, in which FIG. 19A is a schematic plan view when a structure of the quartz crystal resonating element according to the sixth embodiment of the invention is viewed from the top, and FIG. 19B is a cross-sectional view taken along the line P-P of FIG. 19A.

As shown in FIGS. 19A and 19B, a quartz crystal resonating element 305 according to the present modification example is formed by mounting a quartz crystal resonator element 201 which is a modification example of the quartz crystal resonator element 1 of the embodiment shown in FIGS. 1A and 1B on the intermediate substrate 2. The terminals 32a and 32b for joining to the quartz crystal resonator element 201 provided on one main surface of the intermediate substrate 2 are aligned with the corresponding external connection terminals 222a and 222b of the quartz crystal resonator element 201 and are joined thereto via a joining member 40. In addition, the vibrating portion 212 of the quartz crystal resonator element 201 is disposed with a gap by the joining member 40 with respect to one main surface of the intermediate substrate 2 on which the electrode pattern 30 for inductance is formed.

Since, in the quartz crystal resonating element 305, since the recess 216 is formed in the vibrating portion 212 of the quartz crystal resonator element 201, it is possible to provide a resonating element of a high frequency, and since mounting can be performed on the thick part which is integrally formed with the vibrating portion 212, it is possible to provide a resonating element with good resistance to impact or resistance to vibration.

Next, with reference to FIGS. 20 to 22, a detailed description will be made of electronic apparatuses to which the quartz crystal resonating element which is an example of the resonating element according to the first embodiment of the invention is applied.

Figure 20:
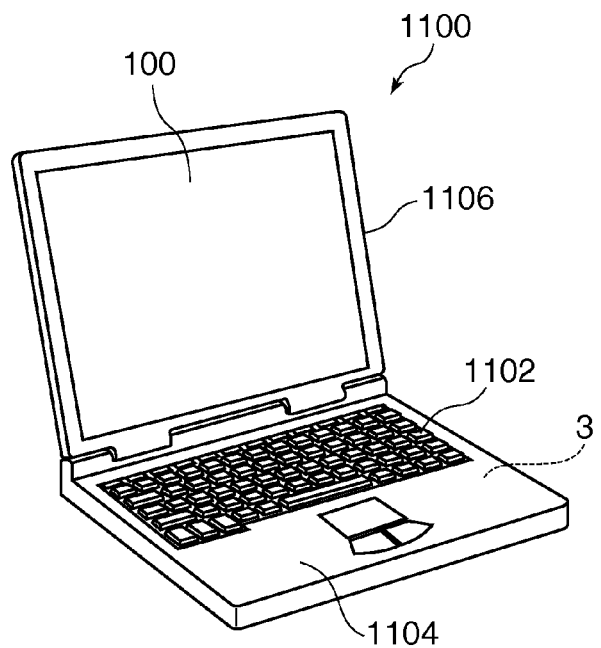
FIG. 20 is a perspective view illustrating a configuration of a mobile type (or a notebook type) personal computer which is an electronic apparatus including the resonating element according to the first embodiment of the invention.

FIG. 20 is a perspective view illustrating a configuration of a mobile type (or a notebook type) personal computer as an electronic apparatus including the quartz crystal resonating element which is an example of the resonating element according to the first embodiment of the invention. In FIG. 20, a personal computer 1100 is constituted by a main body portion 1104 having a keyboard 1102 and a display unit 1106 having a display portion 100, and the display unit 1106 is supported so as to be rotatably moved with respect to the main body portion 1104 via a hinge structure portion. The personal computer 1100 includes the quartz crystal resonating element 3, embedded therein, which functions as a filter, a resonator, a reference clock and the like.

Figure 21:
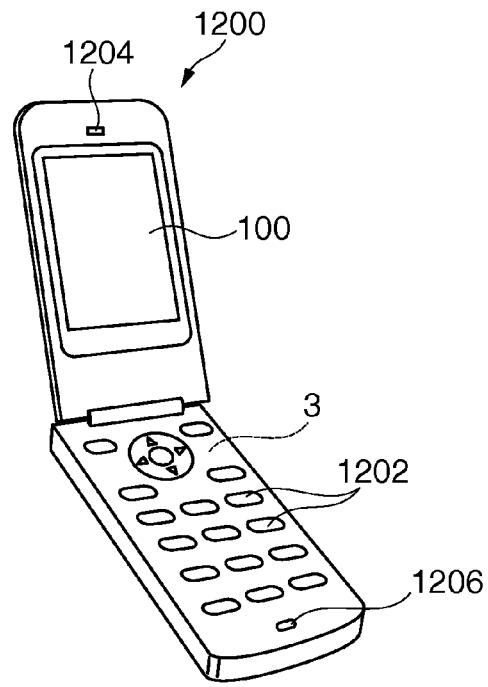
FIG. 21 is a perspective view illustrating a configuration of a mobile phone (including PHS) which is an electronic apparatus including the resonating element according to the first embodiment of the invention.

FIG. 21 is a perspective view illustrating a configuration of a mobile phone (including PHS) as an electronic apparatus including the quartz crystal resonating element which is an example of the resonating element according to the first embodiment of the invention. In FIG. 21, a mobile phone 1200 includes a plurality of operation buttons 1202, an earpiece 1204, and a mouthpiece 1206, and a display portion 100 is disposed between the operation buttons 1202 and the mouthpiece 1204. The mobile phone 1200 includes the quartz crystal resonating element 3, embedded therein, which functions as at least one of a filter, a resonator, and the like.

Figure 22:
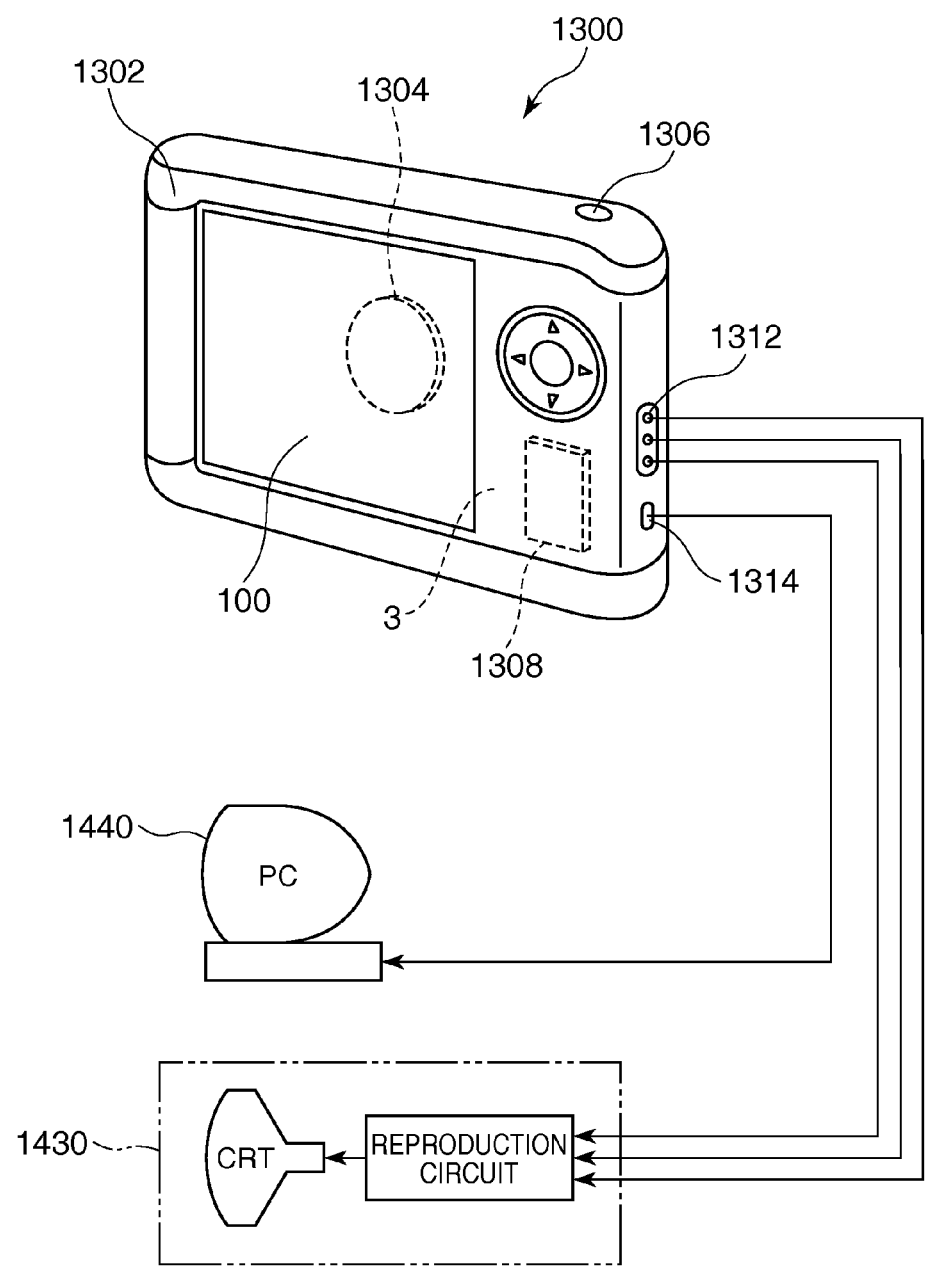
FIG. 22 is a perspective view illustrating a configuration of a digital camera which is an electronic apparatus including the resonating element according to the first embodiment of the invention.

FIG. 22 is a perspective view illustrating a configuration of a digital camera as an electronic apparatus including the quartz crystal resonating element which is an example of the resonating element according to the first embodiment of the invention. In addition, in FIG. 22, connection to an external apparatus is also briefly shown. Here, atypical camera exposes a silver halide photography film to light using a light image of a subject, whereas the digital camera 1300 performs photoelectric conversion on a light image of a subject by using an imaging device such as a Charge Coupled Device (CCD) so as to generate an imaging signal (image signal).

A display portion 100 is provided on a rear side of a case (body) 1302 of the digital camera 1300 and performs display on the basis of an imaging signal generated by the CCD, and the display portion 100 functions a finder which displays a subject as an electronic image. In addition, a light sensing unit 1304 which includes an optical lens (imaging optical system), a CCD, and the like is provided on a front side (the rear side in FIG. 22) of the case 1302.

When a photographer confirms a subject image displayed on the display portion 100 and presses a shutter button 1306, an imaging signal of the CCD at this point is transmitted to and stored in a memory 1308. In addition, in this digital camera 1300, video signal output terminals 1312 and input and output terminals 1314 for data communication are provided on a side surface of the case 1302. Further, as shown in FIG. 22, the video signal output terminals 1312 are connected to a television monitor 1430 and the input and output terminals 1314 for data communication are connected to a personal computer (PC) 1440 as necessary. Furthermore, an imaging signal stored in the memory 1308 is output to the television monitor 1430 or the personal computer 1440 through a predetermined operation. The digital camera 1300 includes the quartz crystal resonating element 3, embedded therein, which functions as a filter, a resonator, and the like.

Further, in addition to the personal computer (a mobile type personal computer) of FIG. 20, the mobile phone of FIG. 21, and the digital camera of FIG. 22, the electronic apparatus including the quartz crystal resonating element which is an example of the resonating element according to the first embodiment of the invention is applicable to, for example, an ink jet type ejection apparatus (for example, an ink jet printer), a laptop type personal computer, a television, a video camera, a video tape recorder, a car navigation apparatus, a pager, an electronic organizer (including a communication function), an electronic dictionary, an electronic calculator, an electronic gaming machine, a word processor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, and the like.

Figure 23:
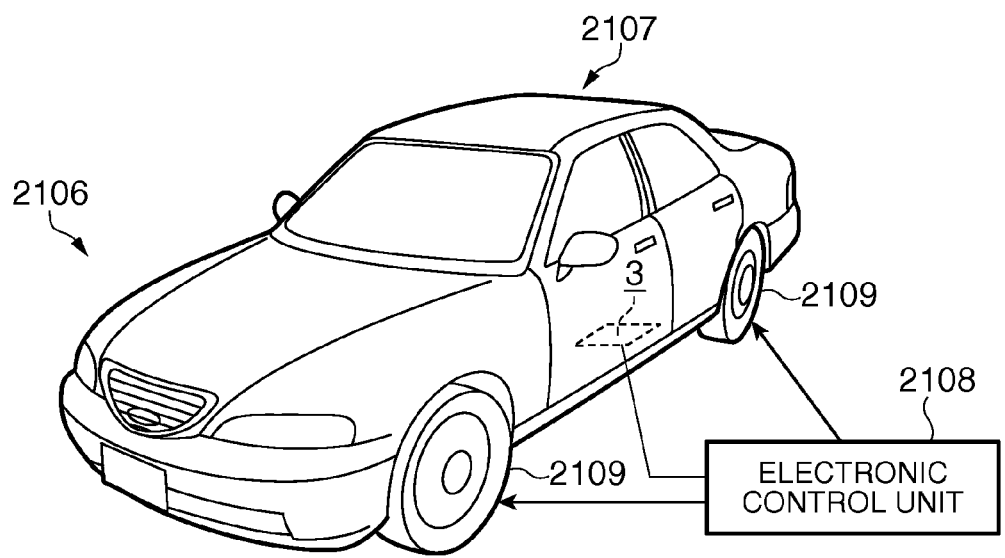
FIG. 23 is a perspective view illustrating a configuration of an automobile which is a moving body to which the resonator or the electronic device including the resonating element according to the first embodiment of the invention is applied.

FIG. 23 is a perspective view schematically illustrating an automobile 2106 which is a specific example of a moving body. In FIG. 23, the quartz crystal resonating element 3 is embedded in an electronic control unit 2108 which controls tires 2109, and is mounted in a car body 2107.

The resonator or the electronic device having the resonating element according to the embodiments of the invention is mounted in the automobile 2106, and is widely applicable to the electronic control unit (ECU) 2108 such as a keyless entry, an immobilizer, a car navigation system, a car air conditioner, an antilock brake system (ABS), an air bag, a tire pressure monitoring system (TPMS), engine control, a battery monitor of a hybrid car or an electric car, and a vehicle dynamic control system.

The entire disclosure of Japanese Patent Application No. 2012-133533, filed Jun. 13, 2012 is expressly incorporated by reference herein.

What is claimed is:

1. A resonating element comprising:
    a base substrate that has first and second base terminals;
    a resonator element that includes a vibrating portion;
    first and second excitation electrodes that are respectively formed on lower and upper surfaces of the vibrating portion;
    an intermediate substrate in which the resonator element is mounted so as to be spaced from the first and second excitation electrodes, the intermediate substrate being mounted to the base substrate, the intermediate substrate being spaced apart from the base substrate; and
    a spiral electrode pattern that is provided on the intermediate substrate and that has first and second ends, wherein
    the first base terminal, the first excitation electrode, and the first and second ends of the spiral electrode pattern are electrically connected to each other,
    the second base terminal and the second excitation electrode are electrically connected to each other.

2. The resonating element according to claim 1, wherein the spiral electrode pattern and the first and second excitation electrodes are connected in series or in parallel to each other.

3. A resonator comprising:
    the resonating element according to claim 2; and
    a package in which the resonating element is mounted by including the intermediate substrate mounted therein.

4. An electronic device comprising:
    the resonating element according to claim 2;
    a package in which the resonating element is mounted by including the intermediate substrate mounted therein; and
    an oscillation circuit that excites the vibrating portion.

5. An electronic apparatus comprising:
    the resonating element according to claim 2.

6. A moving body comprising:
    the resonating element according to claim 2.

7. The resonating element according to claim 1, wherein the spiral electrode pattern and the first and second excitation electrodes are disposed so as not to overlap each other in a plan view.

8. The resonating element according to claim 1, wherein the spiral electrode patterns are provided on the upper and lower surfaces of the intermediate substrate and the spiral electrode patterns are connected in series to each other.

9. The resonating element according to claim 1, wherein the electrode pattern is provided on one main surface of the upper and lower surfaces of the intermediate substrate, a shield electrode is provided on the other main surface of the upper and lower surfaces, and the other main surfaces faces to the first excitation electrode.

10. An electronic device comprising:
    the resonating element according to claim 9;
    a package in which the resonating element is mounted by including the intermediate substrate mounted therein; and
    an oscillation circuit that excites the vibrating portion,
    wherein the shield electrode is connected to a ground terminal of the package.

11. The resonating element according to claim 1, wherein the resonator element includes
    the vibrating portion; and
    an outer edge portion that is integrally formed with an outer edge of the vibrating portion and is thinner than the vibrating portion.

12. The resonating element according to claim 1, wherein the resonator element includes
    the vibrating portion; and
    an outer edge portion that is integrally formed with an outer edge of the vibrating portion and is thicker than the vibrating portion.

13. A resonator comprising:
    the resonating element according to claim 1; and
    a package in which the resonating element is mounted by including the intermediate substrate mounted therein.

14. An electronic device comprising:
    the resonating element according to claim 1;
    a package in which the resonating element is mounted by including the intermediate substrate mounted therein; and
    an oscillation circuit that excites the vibrating portion.

15. An electronic apparatus comprising:
    the resonating element according to claim 1.

16. A moving body comprising:
    the resonating element according to claim 1.

* * * * *